(12) United States Patent
Kogo et al.

(10) Patent No.: US 8,624,852 B2
(45) Date of Patent: Jan. 7, 2014

(54) SEMICONDUCTOR DEVICE FOR DETERMINING WHETHER TOUCH ELECTRODE IS TOUCHED BY HUMAN BODY, AND TOUCH SENSOR USING THE SEMICONDUCTOR DEVICE

(75) Inventors: Teruyuki Kogo, Itami (JP); Kazuhiro Umemoto, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 958 days.

(21) Appl. No.: 12/731,853

(22) Filed: Mar. 25, 2010

(65) Prior Publication Data

US 2010/0302183 A1  Dec. 2, 2010

(30) Foreign Application Priority Data

May 28, 2009 (JP) .................. 2009-128976
Jun. 5, 2009 (JP) .................. 2009-135857
Feb. 10, 2010 (JP) .................. 2010-027688

(51) Int. Cl.
*G06F 3/041* (2006.01)
*G06F 3/043* (2006.01)
*G09G 3/36* (2006.01)
*G01R 27/26* (2006.01)

(52) U.S. Cl.
USPC .............. 345/173; 345/87; 345/177; 324/658

(58) Field of Classification Search
USPC .......................... 323/320; 324/658; 327/170; 345/173–174, 87; 349/54; 370/335
See application file for complete search history.

(56) References Cited

U.S. PATENT DOCUMENTS

| 7,205,776 | B2 | 4/2007 | Kinoshita et al. | |
| 2007/0075710 | A1* | 4/2007 | Hargreaves et al. | 324/658 |
| 2007/0285365 | A1* | 12/2007 | Lee | 345/87 |
| 2008/0231612 | A1* | 9/2008 | Hill et al. | 345/177 |

FOREIGN PATENT DOCUMENTS

| JP | 2006-078292 | 3/2006 |
| JP | 2009-042903 | 2/2009 |

* cited by examiner

*Primary Examiner* — Quan-Zhen Wang
*Assistant Examiner* — Lin Li
(74) *Attorney, Agent, or Firm* — McDermott Will & Emery LLP

(57) ABSTRACT

A touch sensor IC includes a switch for connecting, to an external terminal with its voltage to be sensed, a selected one of a plurality of external terminals to which a plurality of touch electrodes is connected. Only one set of two capacitors and a resistor element may therefore be provided for a plurality of touch electrodes. Thus, the number of required components is smaller as compared with a conventional sensor requiring two capacitors and a resistor element for each touch electrode.

13 Claims, 31 Drawing Sheets

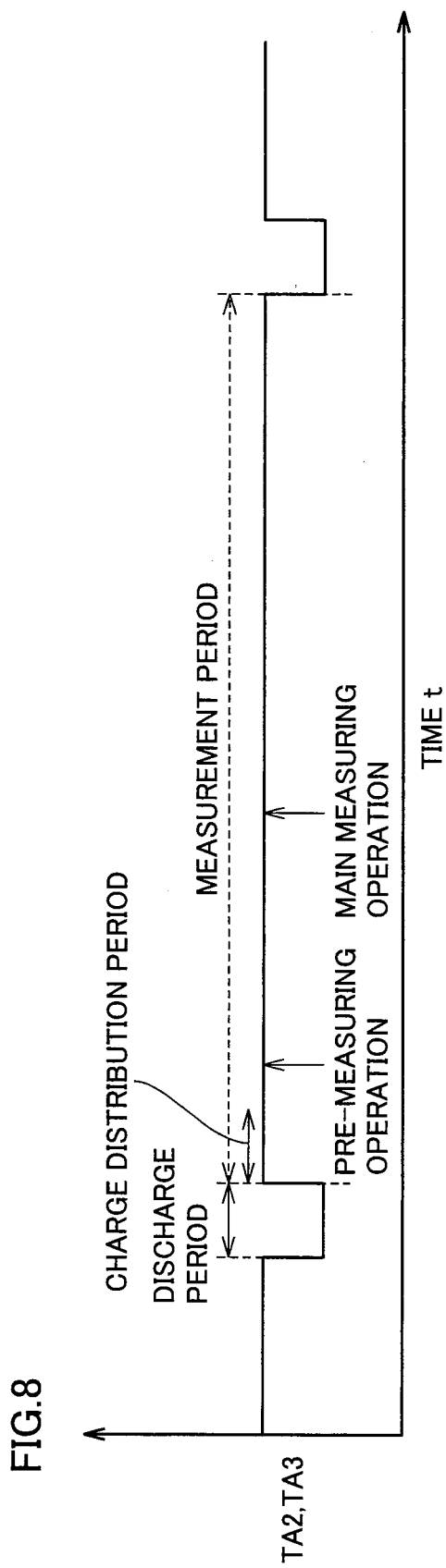

FIG.9A  <MEASUREMENT STEP 1>

| VALUE DETERMINED BY PRE-MEASURING | VALUE DETERMINED BY MAIN MEASURING | PRIMARY COUNTER |
|---|---|---|
| H | H | +1+1=+2 |
| H | L | +1+0=+1 |
| L | H | +0+1=+1 |
| L | L | +0+0=0 |

⇒ TO MEASUREMENT STEP 2

FIG.9B  <MEASUREMENT STEP 2>

| VALUE DETERMINED BY PRE-MEASURING | VALUE DETERMINED BY MAIN MEASURING | PRIMARY COUNTER | SECONDARY COUNTER |
|---|---|---|---|
| H | H | +1+1=+2 | +1 |
| H | L | +1+0=+1 | −1 |
| L | H | +0+1=+1 | +1 |
| L | L | +0+0=0 | −1 |

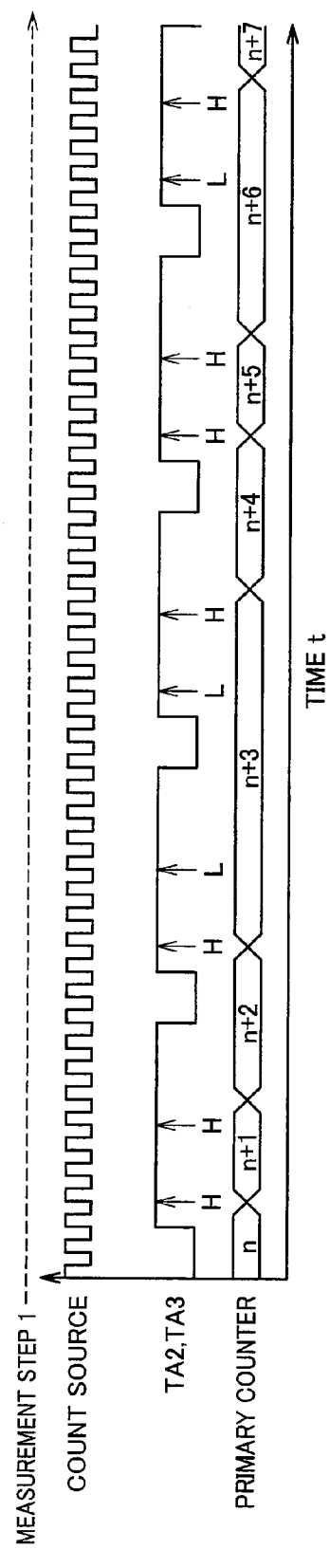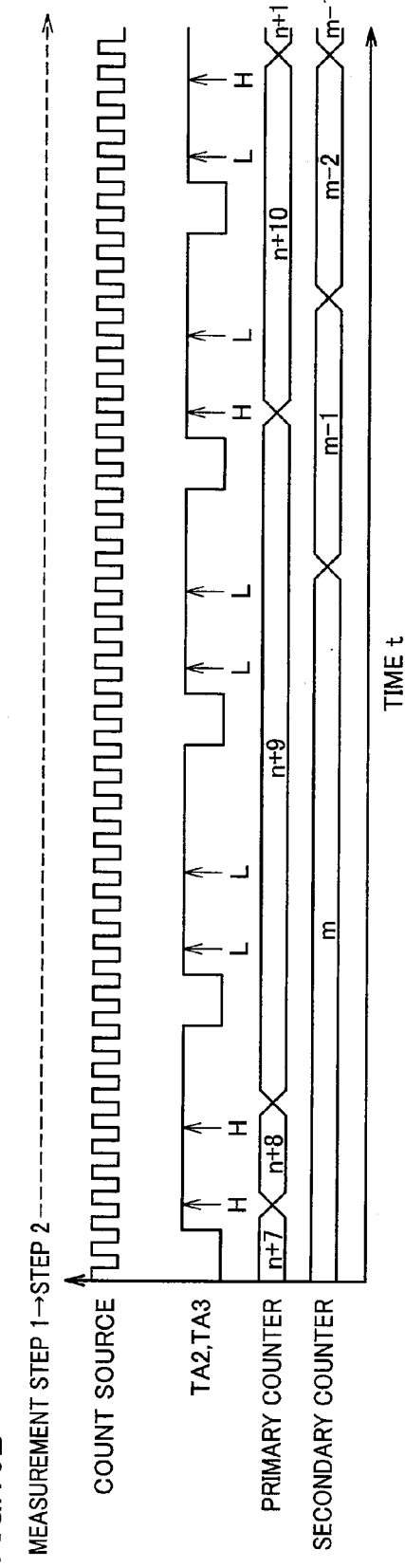

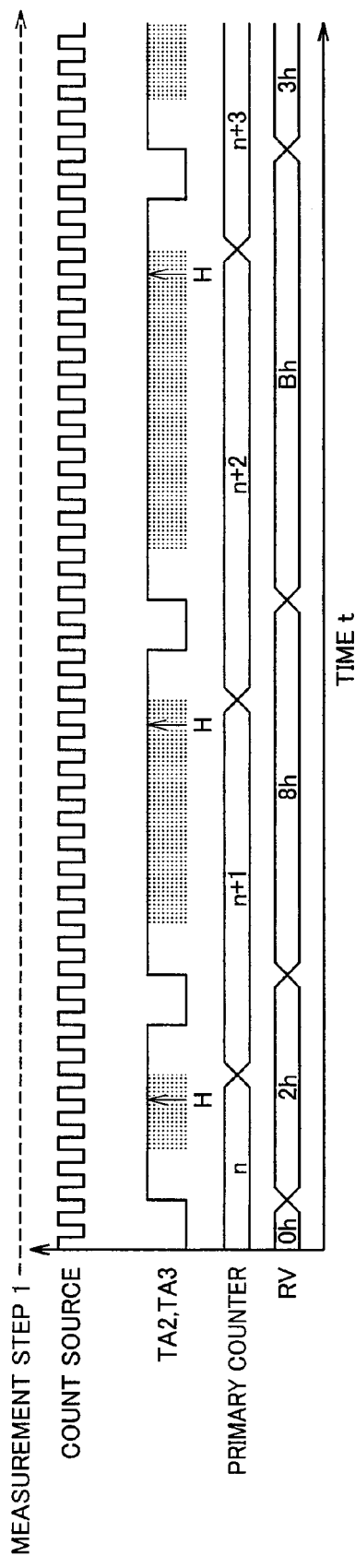
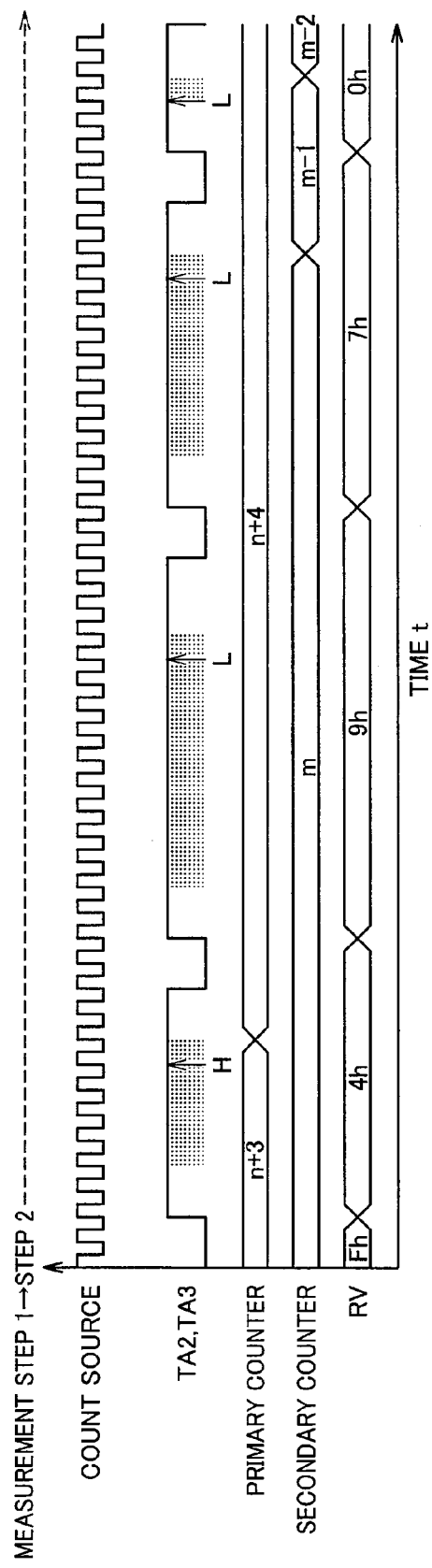

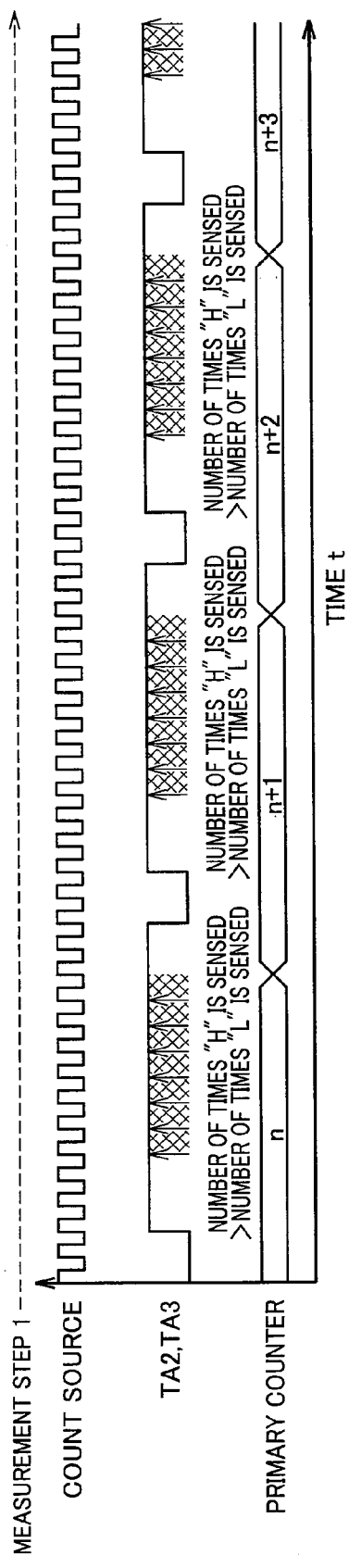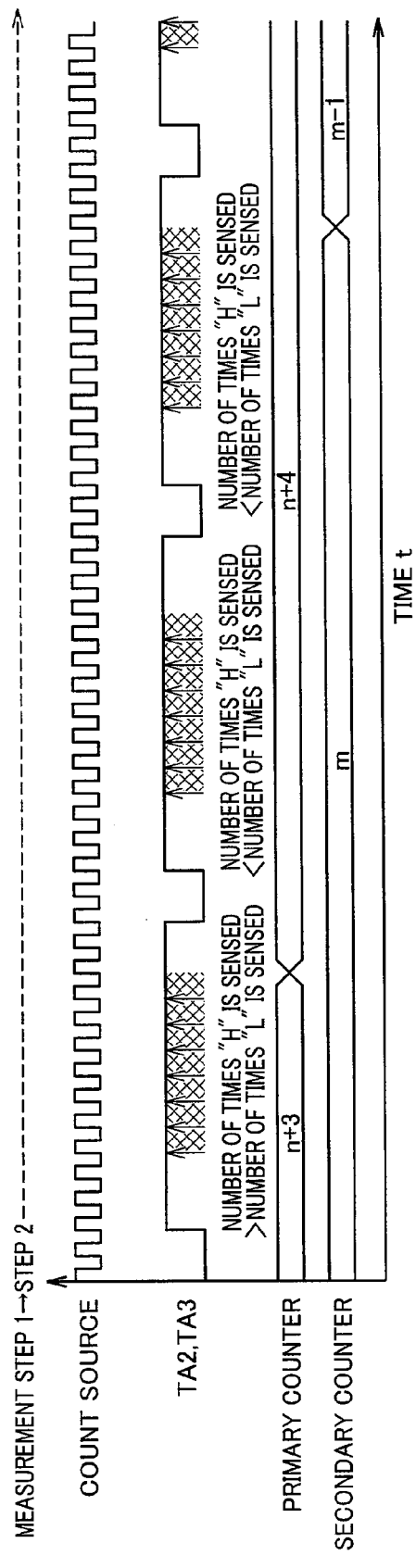

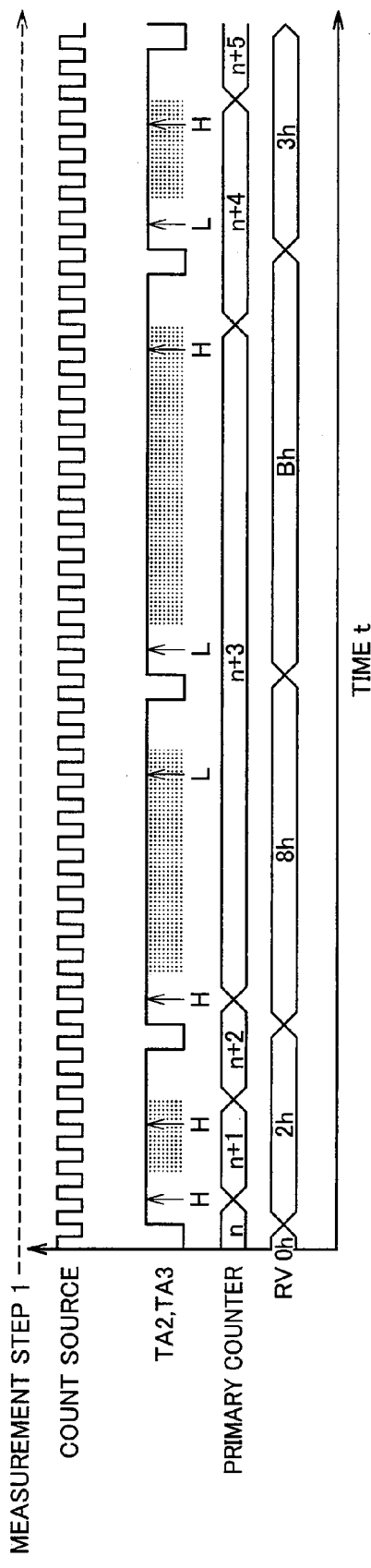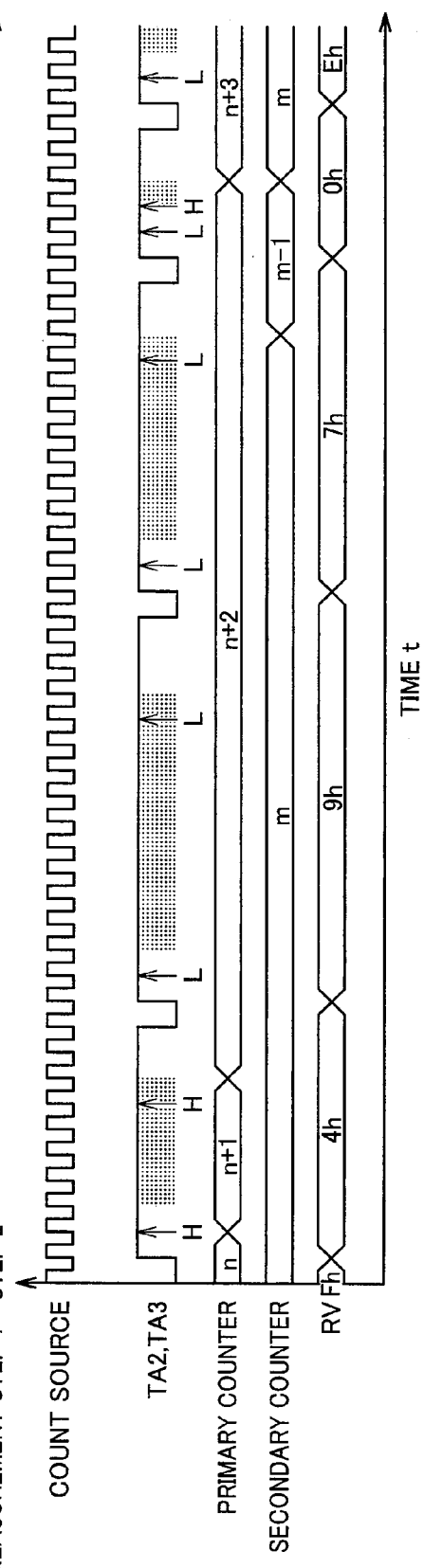

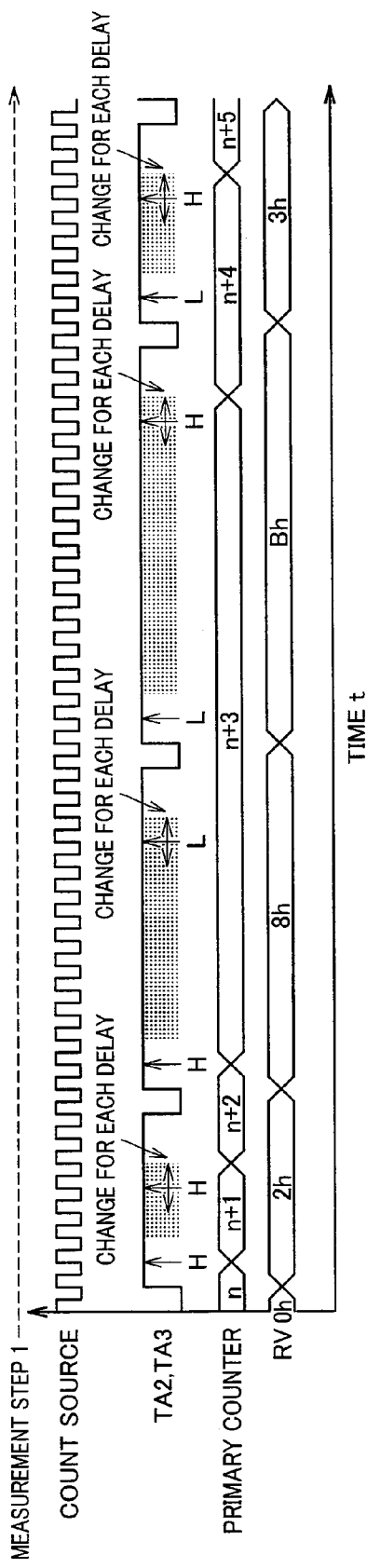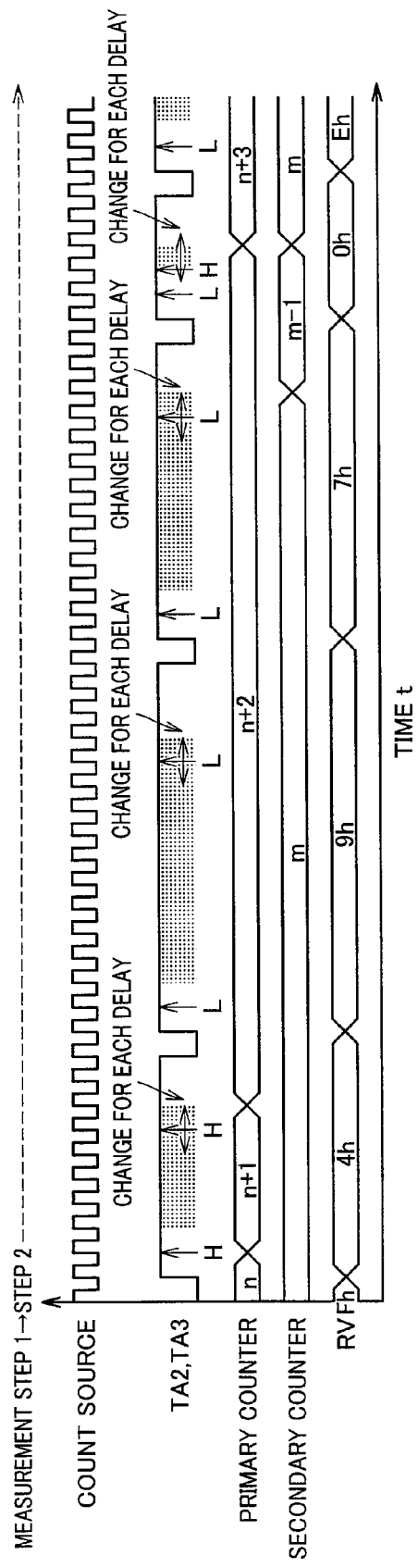

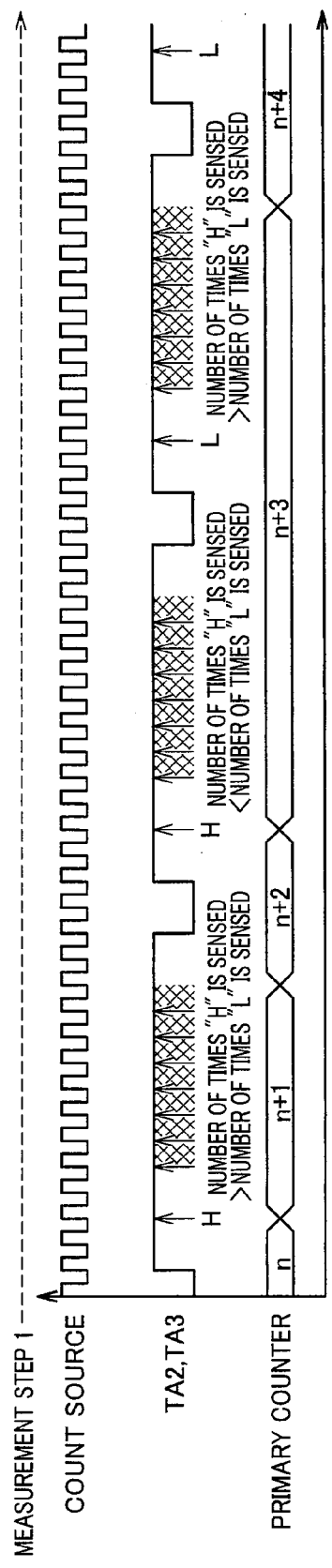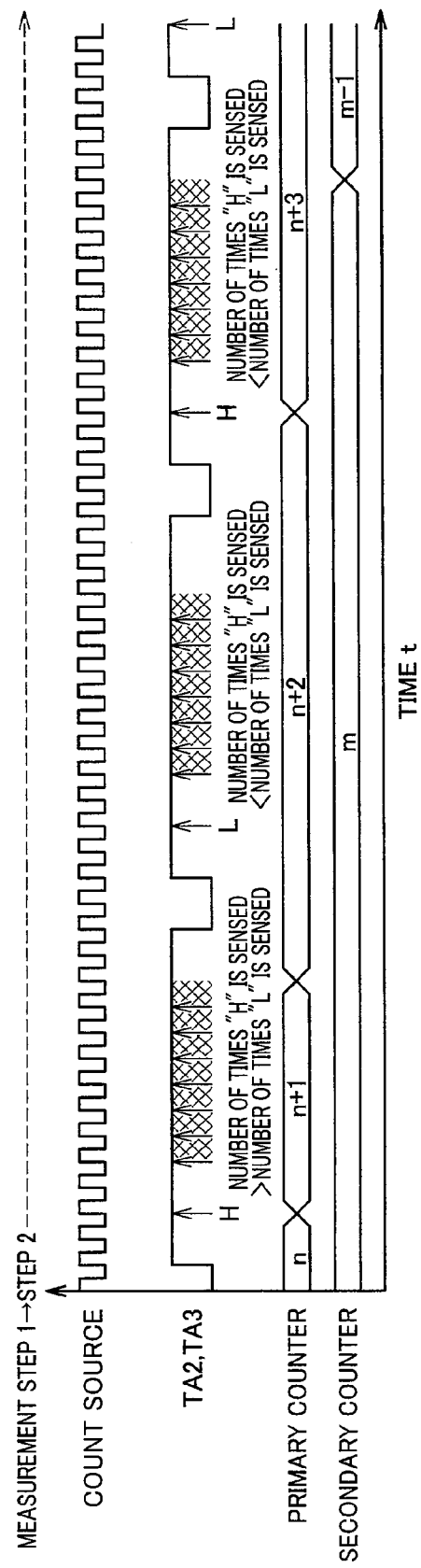

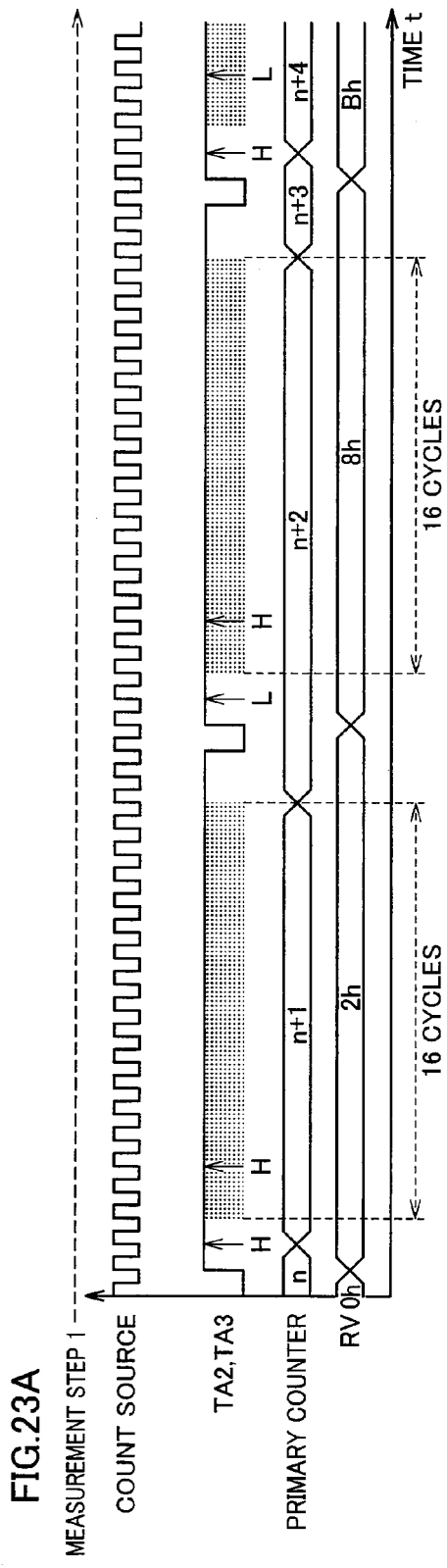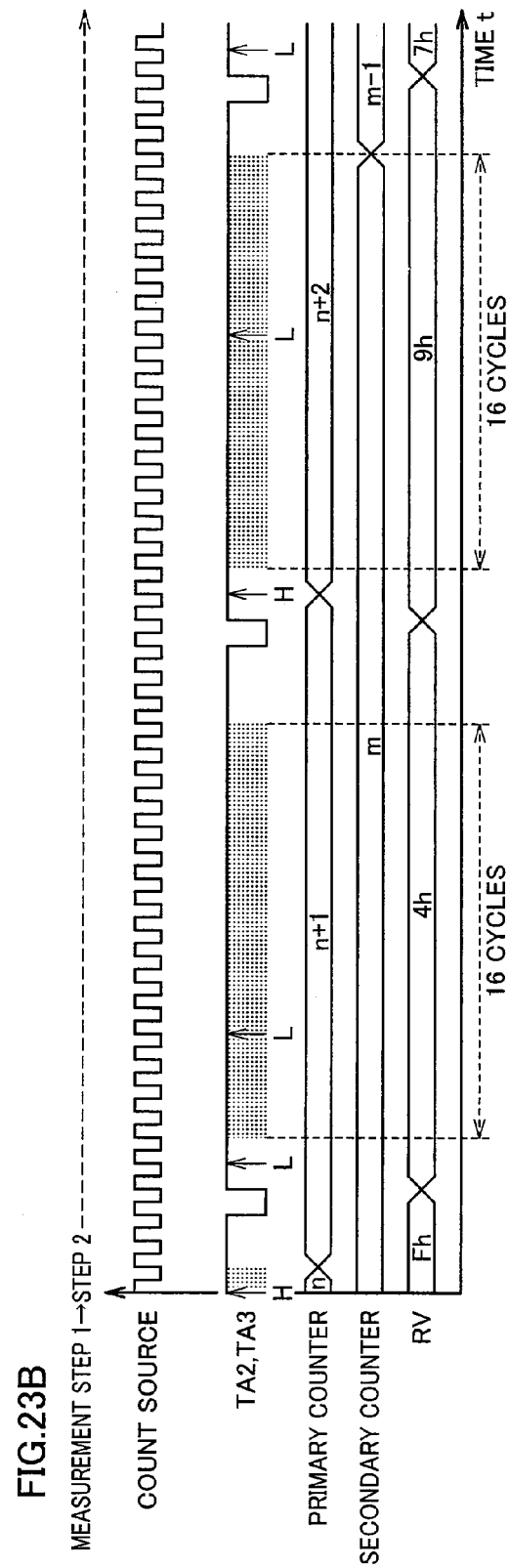

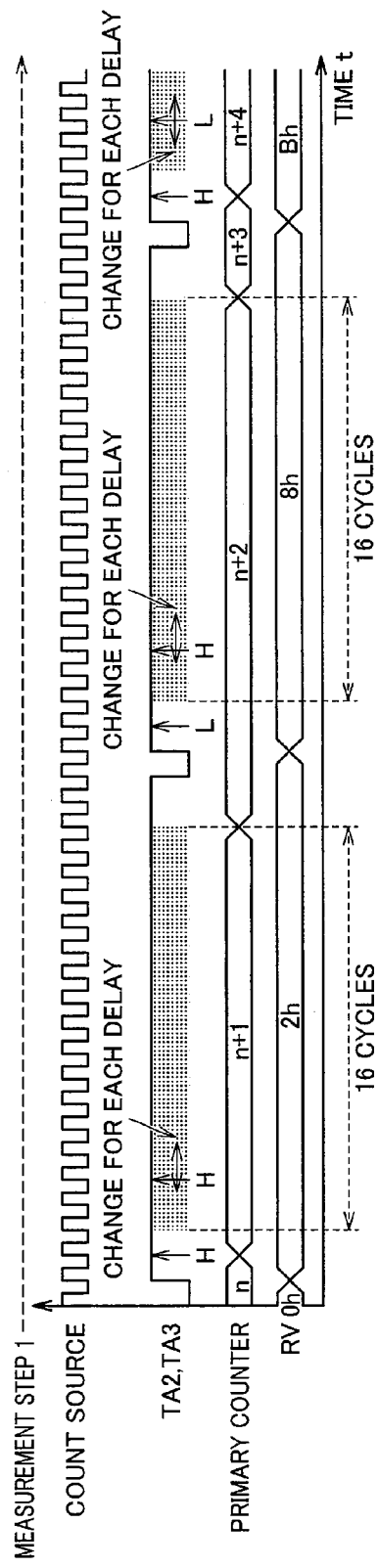
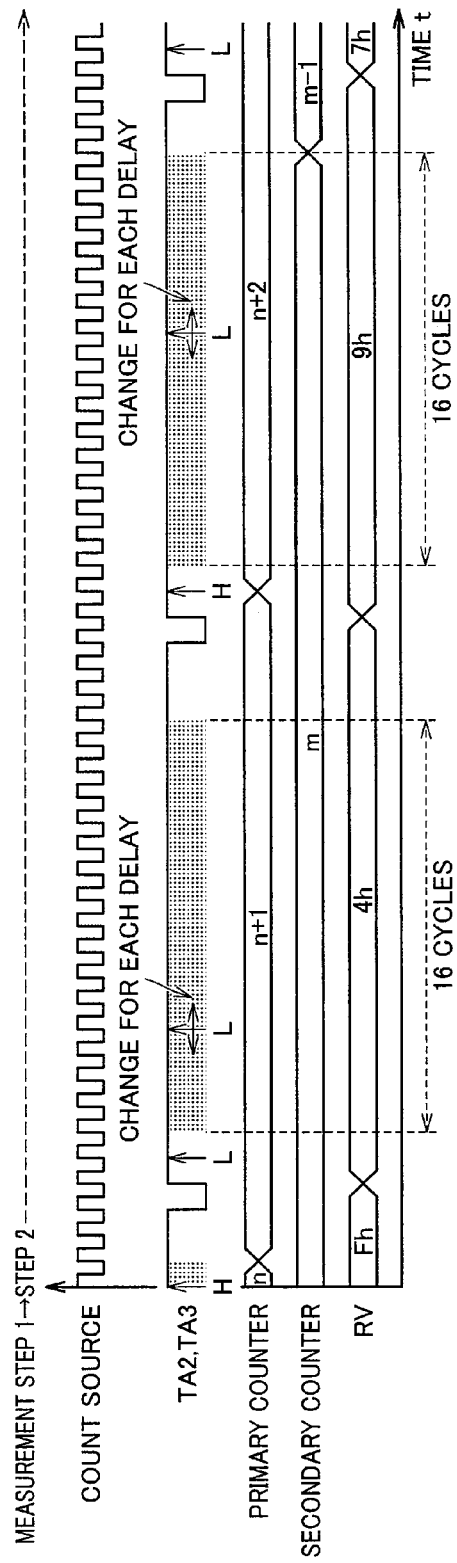
FIG.24A
FIG.24B

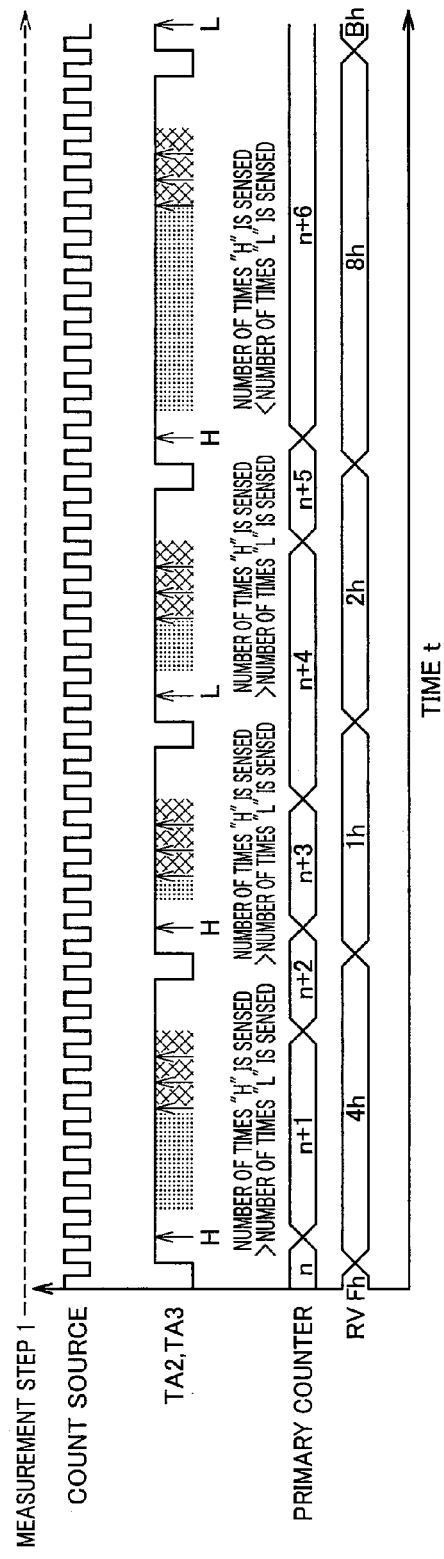
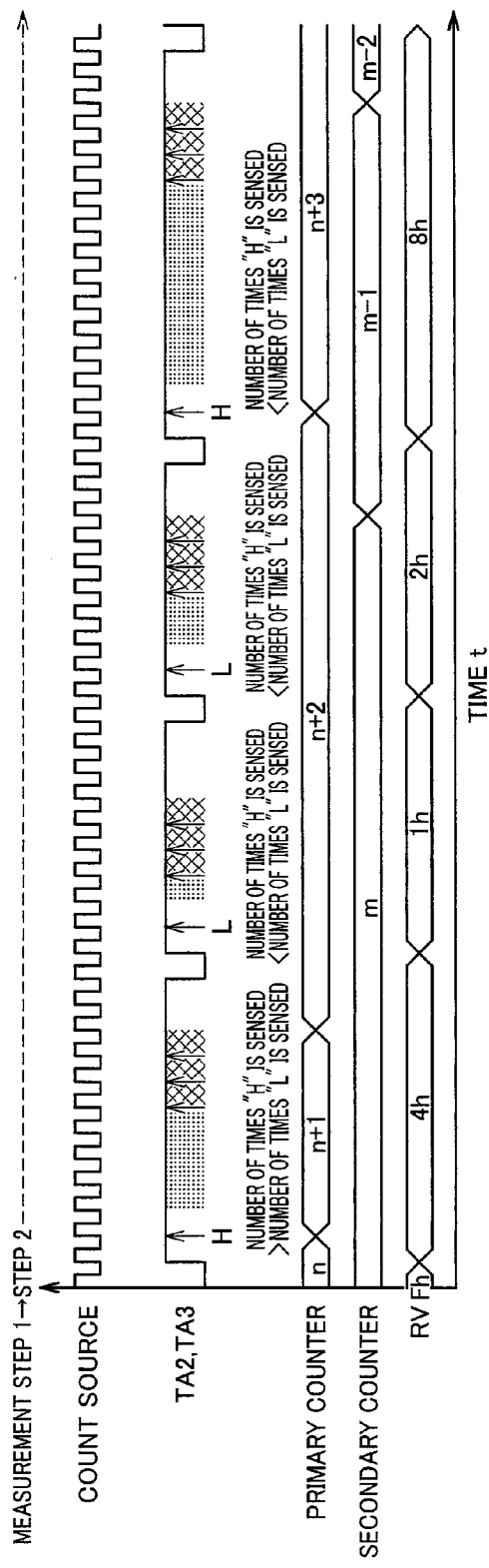
FIG.25A
FIG.25B

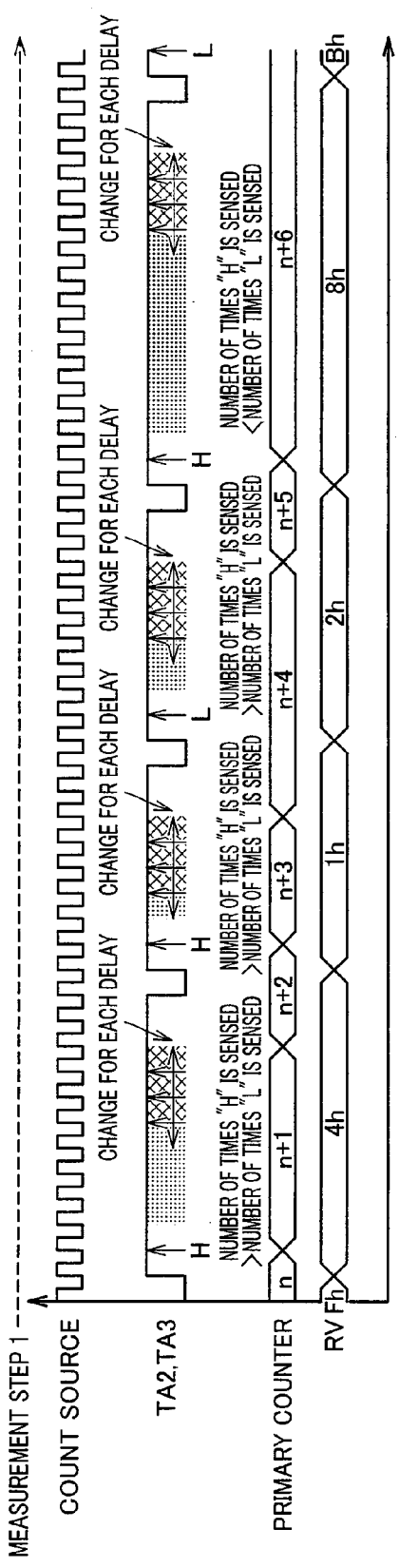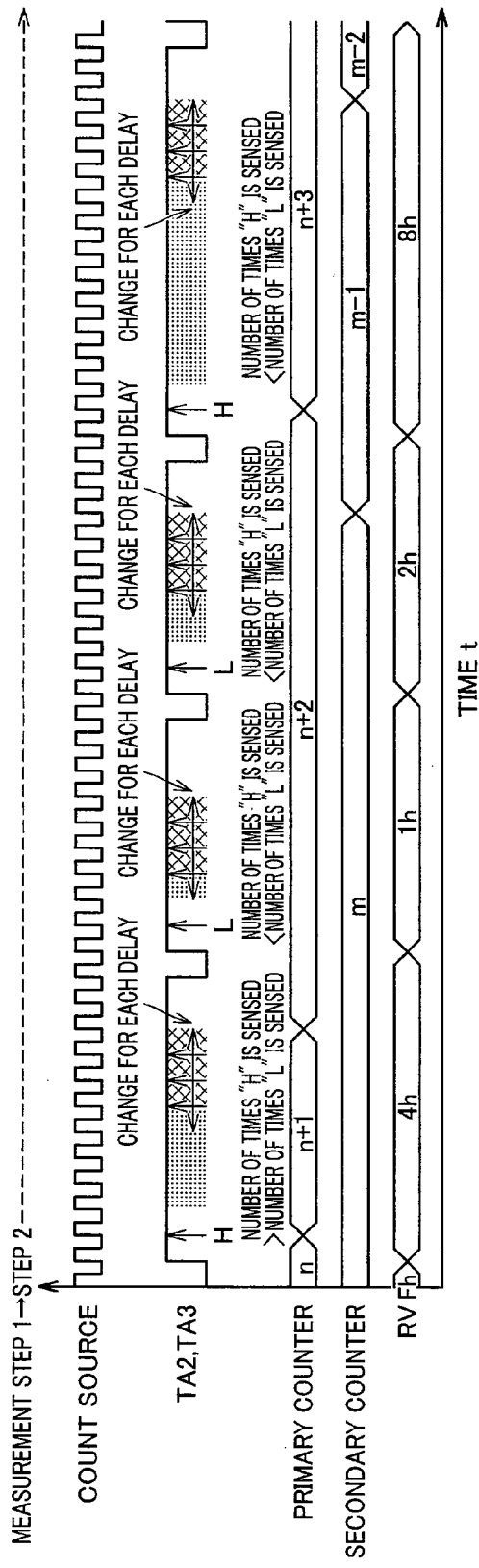

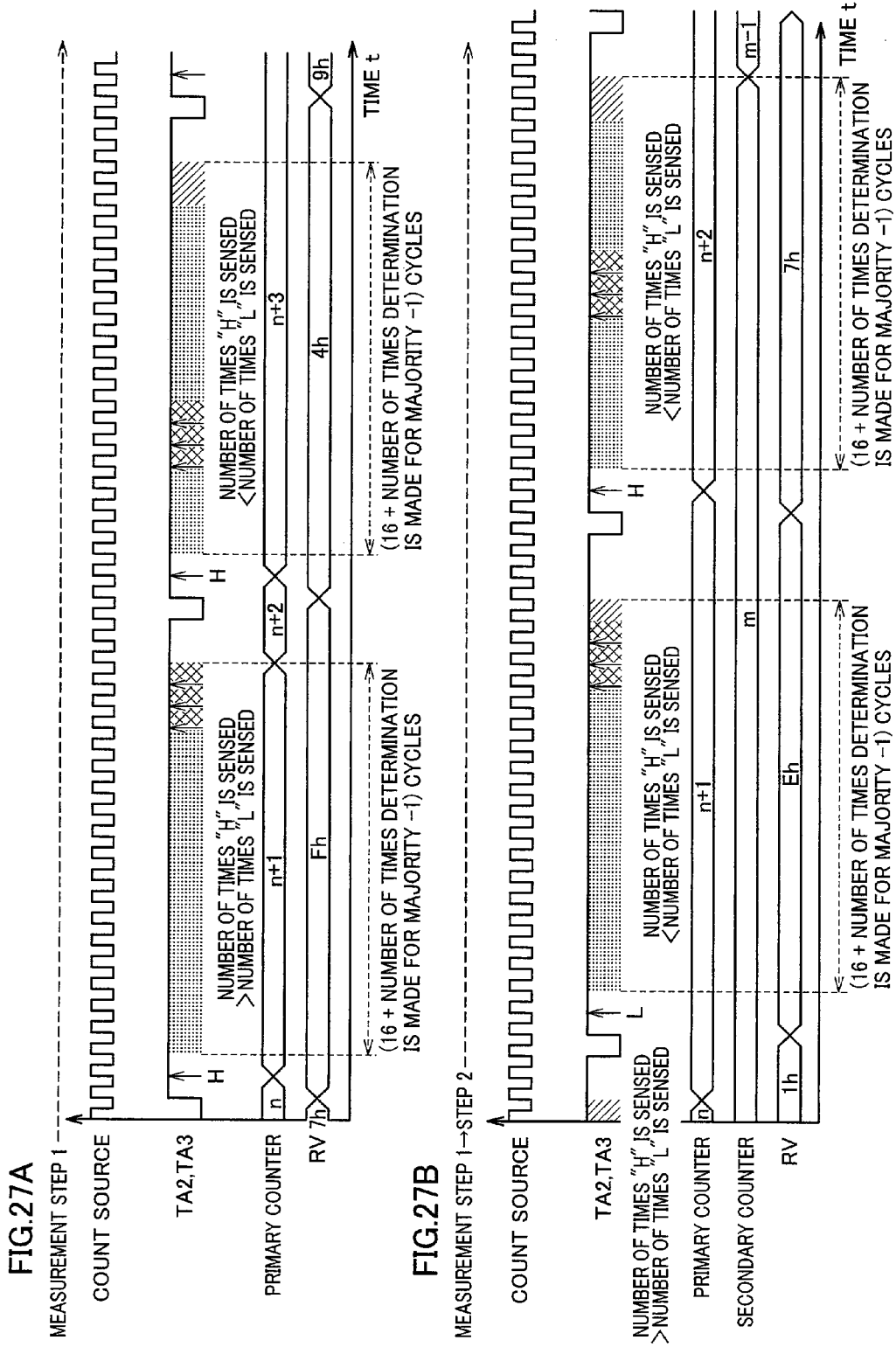

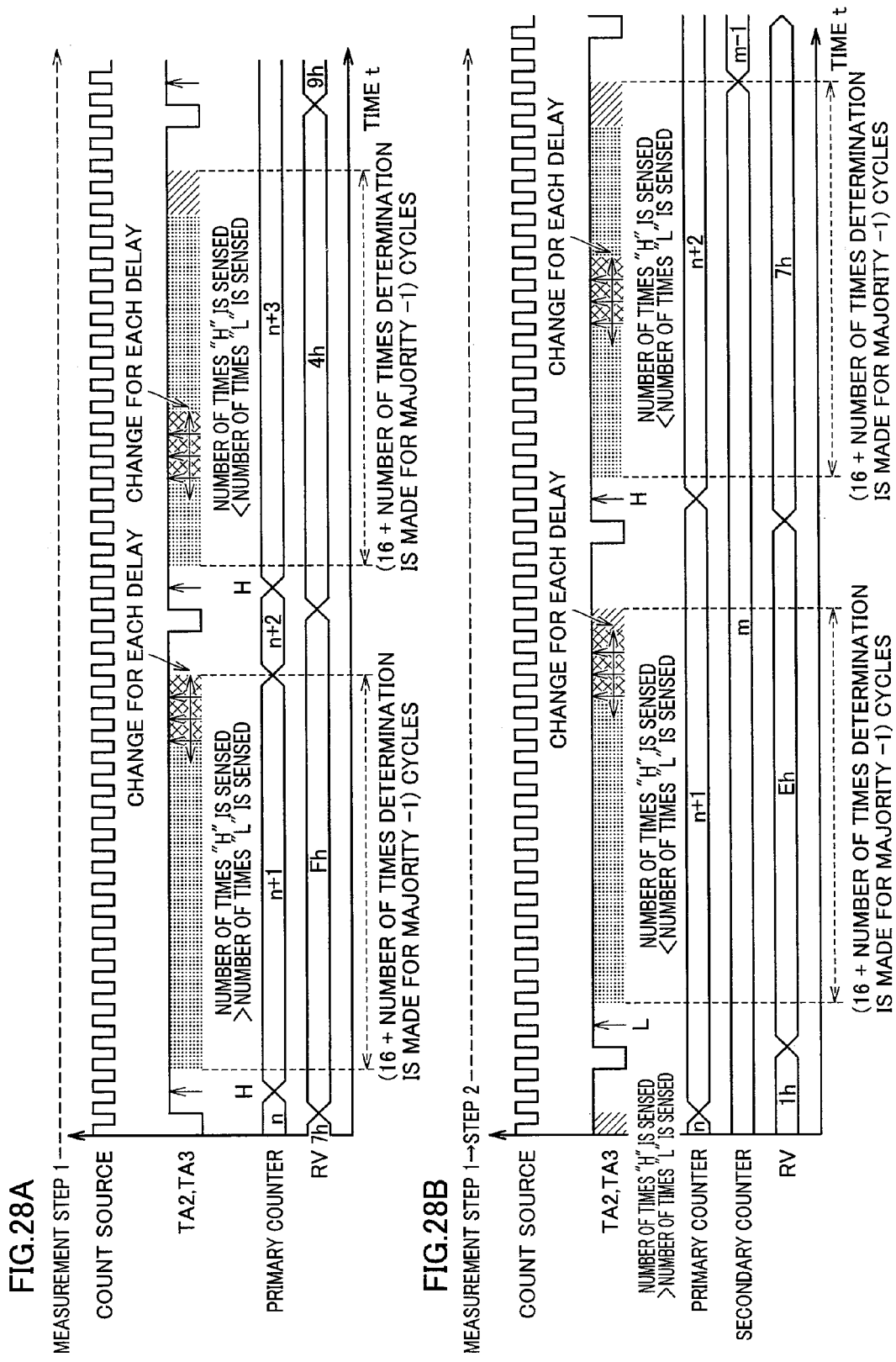

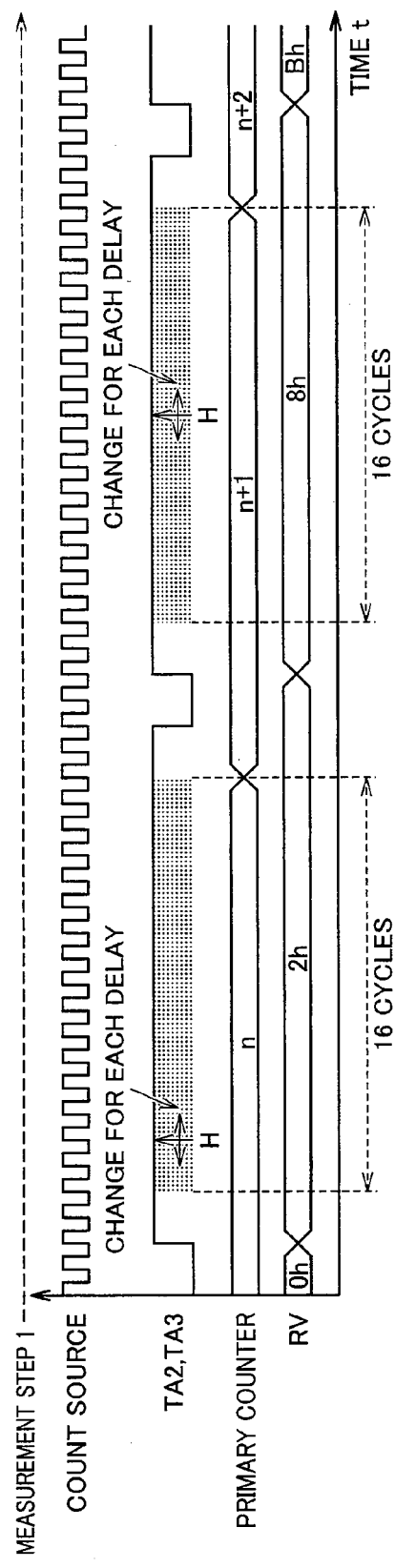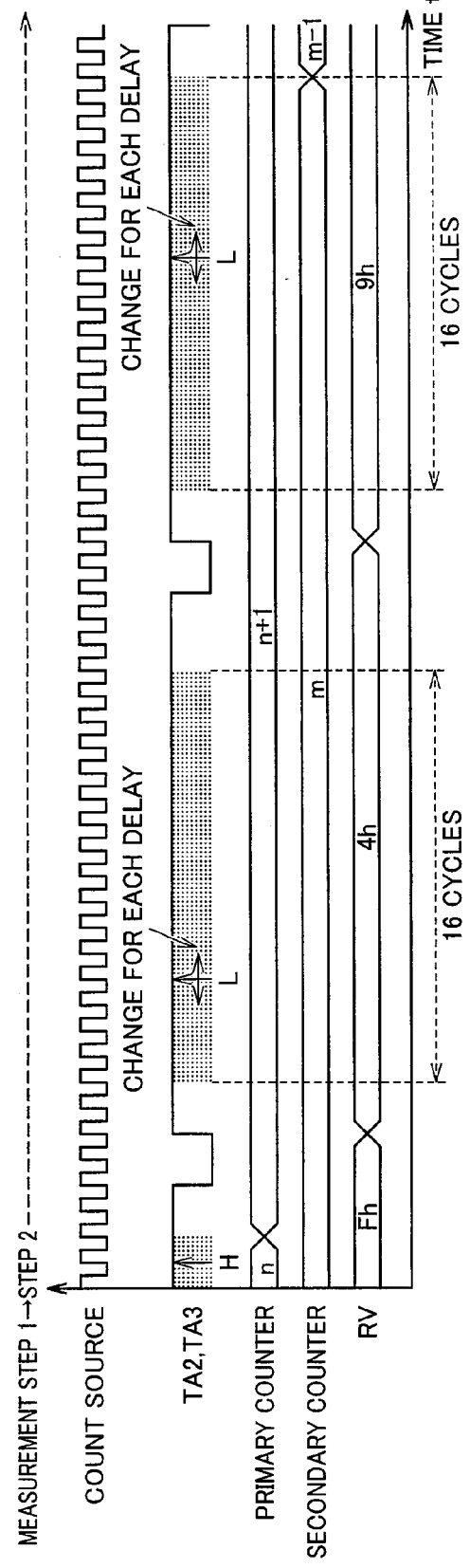

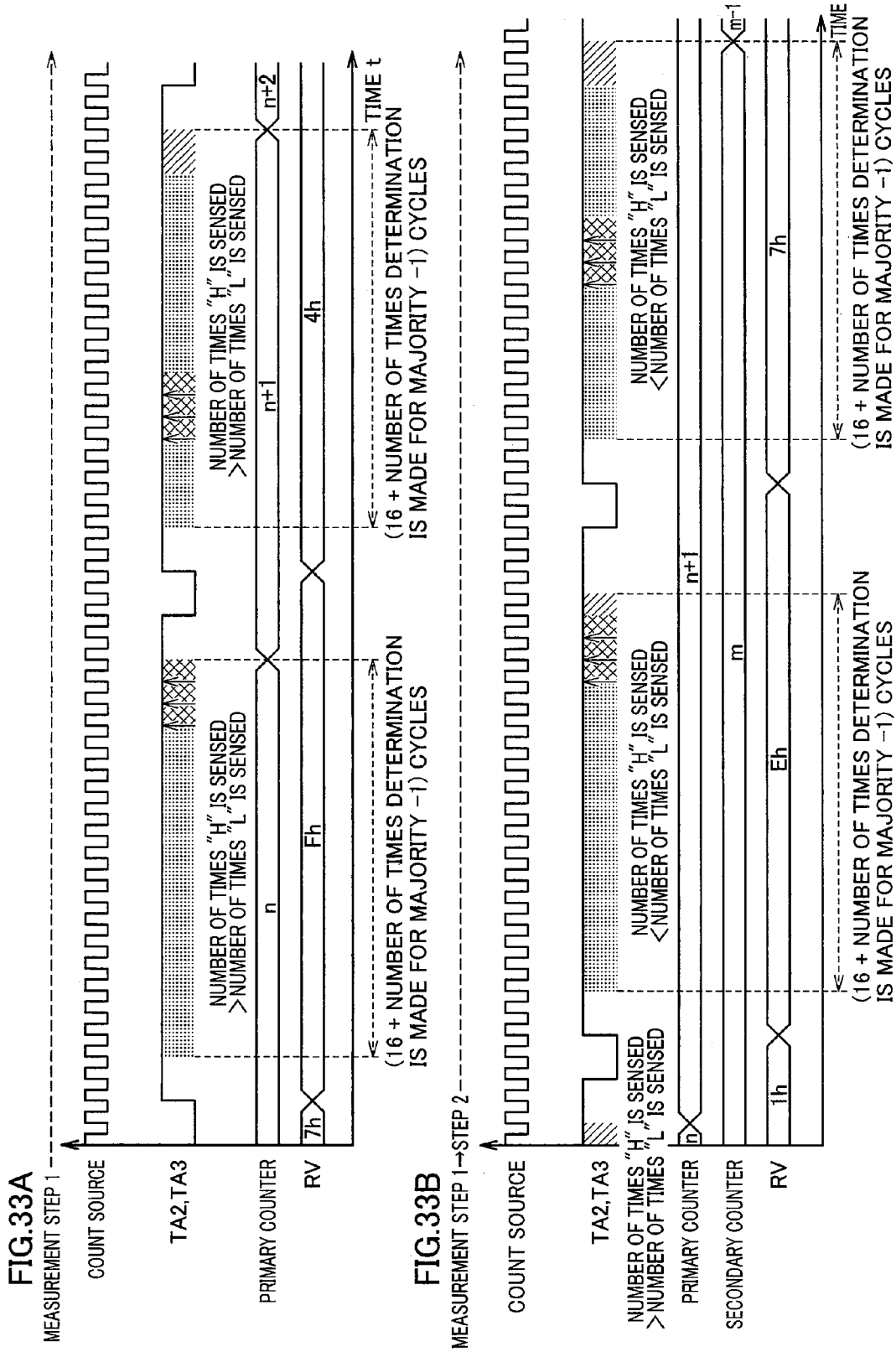

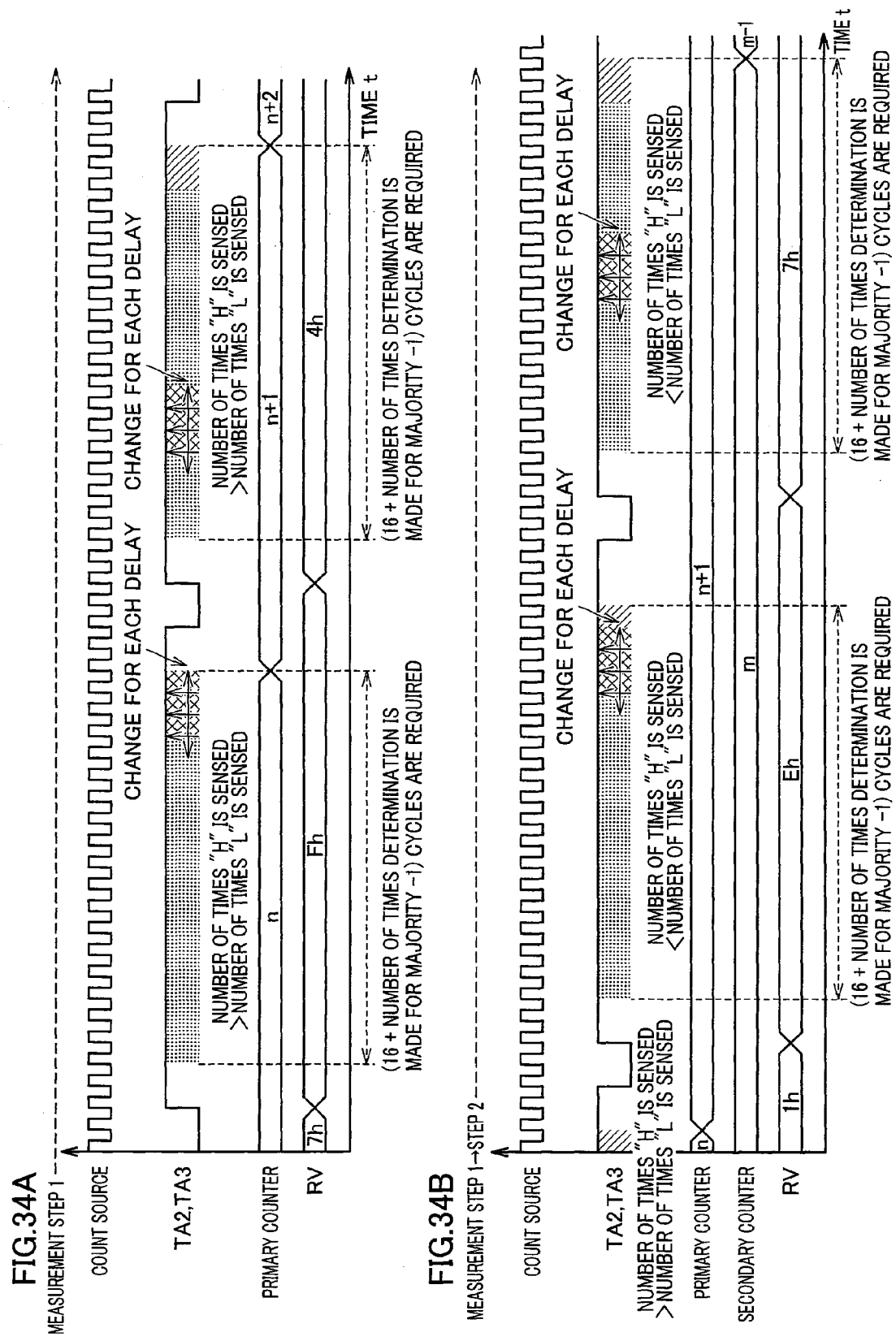

SEMICONDUCTOR DEVICE FOR DETERMINING WHETHER TOUCH ELECTRODE IS TOUCHED BY HUMAN BODY, AND TOUCH SENSOR USING THE SEMICONDUCTOR DEVICE

BACKGROUND OF THE INVENTION

1. Field of the Invention

The present invention relates to a semiconductor device and a touch sensor, and particularly to a semiconductor device for determining whether or not a touch electrode is touched by a human body as well as a touch sensor using the semiconductor device.

2. Description of the Background Art

Touch sensors that determine whether or not a touch electrode is touched by a human body, based on a change in capacitance of the touch electrode, are becoming widespread in these years. Conventional touch sensors are each configured to include a plurality of touch electrodes, two capacitors and a resistor element provided for each touch electrode, an IC (Integrated Circuit) for use in the touch sensor (hereinafter "touch sensor IC"), and a general-purpose microcomputer (see for example Japanese Patent Laying-Open No. 2006-078292).

Japanese Patent Laying-Open No. 2009-042903 discloses a capacitive sensing apparatus configured as follows. Specifically, the capacitive sensing apparatus is equipped with a display apparatus and manipulated according to a display. Specifically the capacitive sensing apparatus includes display means for producing the display, a transparent sensing electrode laid on a display surface of the display means, charging and discharging means for repeatedly charging and discharging the sensing electrode, power storage means changing the voltage according to a charge supplied to and released from the sensing electrode through repeated charging and discharging of the sensing electrode, determination means for making a determination as to whether a value that changes according to a change in voltage of the power storage means has reached a threshold, capacitance calculation means for calculating a capacitance of the sensing electrode based on the number of times the charging and discharge means charges and discharges before the determination is made by the determination means, and control means for controlling the whole state and operation. The determination means makes a comparison between the value that changes according to a change in voltage of the power storage means and the threshold, each time the charging and discharging means charges and discharges. When the value is equal to or more than the threshold in two or more successive comparisons, the determination means determines that the threshold has been reached.

The conventional touch sensor having two capacitors and a resistor element for each of a plurality of touch electrodes, however, has a problem that a large number of externally-mounted components is required for the touch sensor IC. An increased number of externally-mounted components leads to an increased size of the touch sensor and increased cost. Further, because of a greater influence of difference between the externally-mounted components, malfunction is more likely to occur. In addition, an increased number of external terminals of the touch sensor IC is required for connecting the externally-mounted components.

In the conventional touch sensor, a CPU of the microcomputer executes software (program) to control the touch sensor IC and determine whether or not a touch electrode is touched by a human body. Then, another problem arises that the microcomputer has to bear a heavy load, resulting in increased power consumption.

As for Japanese Patent Laying-Open No. 2006-078292, a measurement of voltage is taken per charging/discharging. In the case where noise is generated in the period in which the measurement is taken, the measurement as taken could be in error depending on the intensity of the noise. As for Japanese Patent Laying-Open No. 2009-042903, a plurality of measurement periods is provided per charging/discharging and a measurement of voltage is taken in each measurement period. In the case where noise is generated in this measurement period, it is highly possible that the measurement as taken is in error depending on the characteristics of the noise. Japanese Patent Laying-Open No. 2009-042903 discloses that multiple measurements are taken with the aim of reducing noise from the display apparatus. The noise from the display apparatus has a relatively high frequency, and Japanese Patent Laying-Open No. 2009-042903 is based on the assumption that noise will be detected in a relatively small number of measurement periods among the multiple measurement periods. In contrast, when a touch electrode is touched by a human body and noise of a relatively low frequency arises from the human body, the noise is detected in a greater number of measurement periods among the multiple measurement periods.

SUMMARY OF THE INVENTION

A chief object of the present invention is therefore to provide a semiconductor device with which the number of components of a touch sensor can be reduced as well as a touch sensor using the semiconductor device.

Another object of the invention is to provide a semiconductor device capable of lessening the influence of noise and thereby appropriately determining whether a touch electrode is touched by a human body, as well as a touch sensor using the semiconductor device.

A semiconductor device according to the present invention includes: a plurality of first terminals connected to a plurality of touch electrodes, respectively; a second terminal connected via a capacitor to a line of a reference voltage; a switch circuit for connecting, to a predetermined node, one of the plurality of first terminals that is associated with a touch electrode selected from the plurality of touch electrodes; and a charging and discharging circuit for performing a charging operation of charging the capacitor, a discharging operation of releasing a charge from the selected touch electrode, and a distributing operation of distributing a charge of the capacitor via the predetermined node to the selected touch electrode. Whether the selected touch electrode is touched by a human body is determined based on a voltage of the predetermined node.

The semiconductor device of the present invention includes the switch circuit for connecting, to a predetermined node with its voltage to be sensed, a touch electrode selected from a plurality of touch electrodes. Therefore, only one capacitor is enough for a plurality of touch electrodes. The number of components of the touch sensor can thus be reduced.

Preferably, the charging and discharging circuit alternately performs the discharging operation and the distributing operation after performing the charging operation. The semiconductor device includes a sensing circuit for making a comparison N times (N is an integer of not less than 2), at respective timings different from each other in a measurement period from a start of the distributing operation to a start of the subsequent discharging operation, between the voltage of the predetermined node and a predetermined threshold voltage, and generating, based on a result of the comparison made N times, a signal representing whether the selected touch electrode is touched by a human body.

In this way, the influence of low frequency and high frequency noises can be lessened, and whether a touch electrode is touched by a human body can be appropriately determined.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a waveform chart illustrating a voltage determining operation of the touch sensor including the control circuit shown in FIG. 6.

FIGS. 9A and 9B illustrate a counting operation of a primary counter and a secondary counter shown in FIG. 6.

FIGS. 10A and 10B illustrate an example of the measuring operation of the touch sensor including the control circuit shown in FIG. 6.

FIGS. 16A and 16B illustrate an example of the measuring operation of the touch sensor including the control circuit shown in FIG. 13.

FIGS. 18A and 18B illustrate an example of the measuring operation by means of the control circuit of the touch sensor as described with FIGS. 17A and 17B.

FIGS. 20A and 20B to FIGS. 34A and 34B illustrate respective examples of the measuring operation by means of respective control circuits of touch sensors according to the seventh to twenty-first embodiments of the present invention, respectively.

DESCRIPTION OF THE PREFERRED EMBODIMENTS

Figure 1:
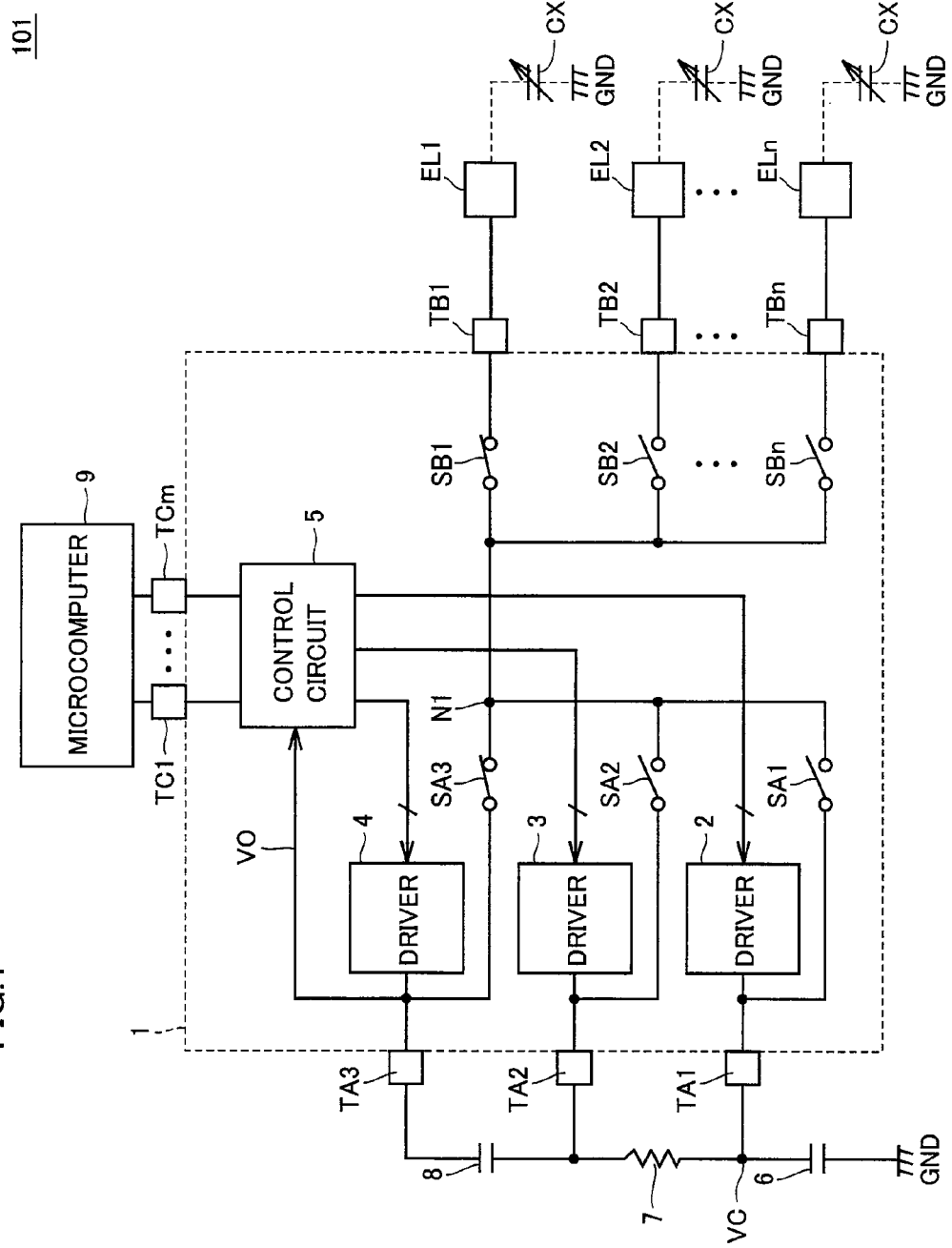
FIG. 1 shows a configuration of a touch sensor according to a first embodiment of the present invention.

Embodiments of the present invention will be hereinafter described with reference to the drawings. In the drawings, the same or corresponding components are denoted by the same reference characters, and a description thereof will not be repeated.

First Embodiment

FIG. 1 illustrates a configuration of a touch sensor according to a first embodiment of the present invention.

Referring to FIG. 1, touch sensor 101 includes an IC (semiconductor device) 1 for use in the touch sensor (hereinafter "touch sensor IC"), n (n is an integer of not less than two) touch electrodes EL1 to ELn, capacitors 6, 8, a resistor element 7, and a microcomputer 9.

Touch sensor IC 1 includes a plurality of external terminals TA1 to TA3, TB1 to TBn, TC1 to TCm (m is an integer of not less than one), drivers (charging and discharging circuit) 2 to 4, switches SA1 to SA3, SB1 to SBn, and a control circuit 5.

Capacitor 6 has one electrode connected to external terminal TA1 and the other electrode receiving ground voltage GND. The capacitance of capacitor 6 is set for example to approximately 0.1 µF. Resistor element 7 is connected between external terminals TA1 and TA2. The resistance of resistor element 7 is set for example to approximately 3 to 10 kΩ. Capacitor 8 is connected between external terminals TA2 and TA3. The capacitance of capacitor 8 is set for example to approximately 1 to 50 pF.

Touch electrodes EL1 to ELn are connected to external terminals TB1 to TBn, respectively. Touch electrode EL has its surface covered with an insulating layer, and thus a capacitor is formed by touch electrode EL. Namely, touch electrode EL has a predetermined capacitance and the capacitance changes depending on the presence or absence of a touch with a human body (human fingertip for example). In FIG. 1, respective capacitances of touch electrodes EL1 to ELn are represented by variable-capacitance capacitors CX1 to CXn. The capacitance of touch electrode EL when touch electrode EL is touched by a human body (11 pF for example) is larger than the capacitance of touch electrode EL when not touched by a human body (10 pF for example). Touch electrodes EL1 to ELn are constituent elements of a touch panel of an electrical device (portable terminal for example).

Microcomputer 9 is connected to external terminals TC1 to TCm and controls touch sensor IC 1. Further, microcomputer 9 receives, from touch sensor IC 1, a signal indicating whether touch electrodes EL1 to ELn are each touched by a human body and, in response to the signal, controls the electrical device to be controlled.

Respective output nodes of drivers 2 to 4 are connected to external terminals TA1 to TA3. Drivers 2 to 4 are each controlled by control circuit 5, and control associated external terminal TA so that external terminal TA is set into an "H" level (power supply voltage VCC) state, "L" level (ground GND) state or HiZ (high impedance) state. Drivers 2 to 4 are provided for charging and discharging capacitors 6, 8, CX to CXn.

Figure 2:
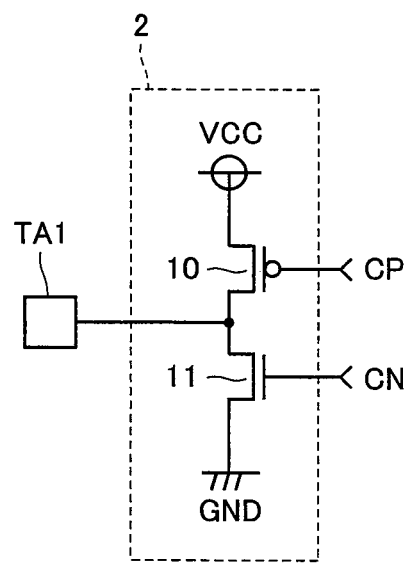
FIG. 2 is a circuit diagram illustrating a configuration of a driver shown in FIG. 1.

FIG. 2 is a circuit diagram showing a configuration of driver 2. Referring to FIG. 2, driver 2 includes a P-channel MOS transistor 10 and an N-channel MOS transistor 11. Transistor 10 has its source receiving power supply voltage VCC, its drain connected to external terminal TA1 and its gate receiving control signal CP from control circuit 5. Transistor 11 has its source receiving ground voltage GND, its drain connected to external terminal TA1 and its gate receiving control signal CN from control circuit 5. A connection node between respective drains of transistors 10 and 11 is an output node of driver 2.

When both of control signals CP, CN are set to "L" level, transistor 10 is turned on, transistor 11 is turned off and the output node of driver 2 is set to "H" level. When both of control signals CP, CN are set to "H" level, transistor 10 is turned off, transistor 11 is turned on and the output node of driver 2 is set to "L" level. When control signals CP, CN are set respectively to "L" level and "H" level, both of transistors 10, 11 are turned off and the output node of driver 2 is set to the HiZ state. Drivers 3, 4 are configured in the same way as driver 2.

Referring again to FIG. 1, switch SA1 has one terminal connected to external terminal TA1, switch SA2 has one terminal connected to external terminal TA2 and switch SA3 has one terminal connected to external terminal TA3. Respective other terminals of switches SA1 to SA3 are all connected to a node N1. Switches SB1 to SBn have respective terminals that are each one terminal of the switch and connected to node N1, and respective other terminals are connected to external terminals TB1 to TBn, respectively. Switches SA3, SB1 to SBn are used, for example, for connecting n touch electrodes EL1 to ELn to external terminal TA3 in such a manner that each touch electrode is connected thereto for a predetermined period of time. In the state shown in FIG. 1, switches SA3, SB1 are turned on to connect touch electrode EL1 to external terminal TA3. Switches SA1 to SA3 are used, for example, for short-circuiting external terminals TA1 to TA3 to reset the voltage of external terminals TA1 to TA3 to "L" level.

Control circuit 5 controls drivers 2 to 4 and switches SA1 to SM, SB1 to SBn, makes a determination as to whether a human body touches touch electrodes EL1 to ELn each or generates data for making the determination, and outputs, to microcomputer 9, a signal indicating the result of the determination or a signal indicating the fact that the data for making the determination has been generated.

Figure 3:
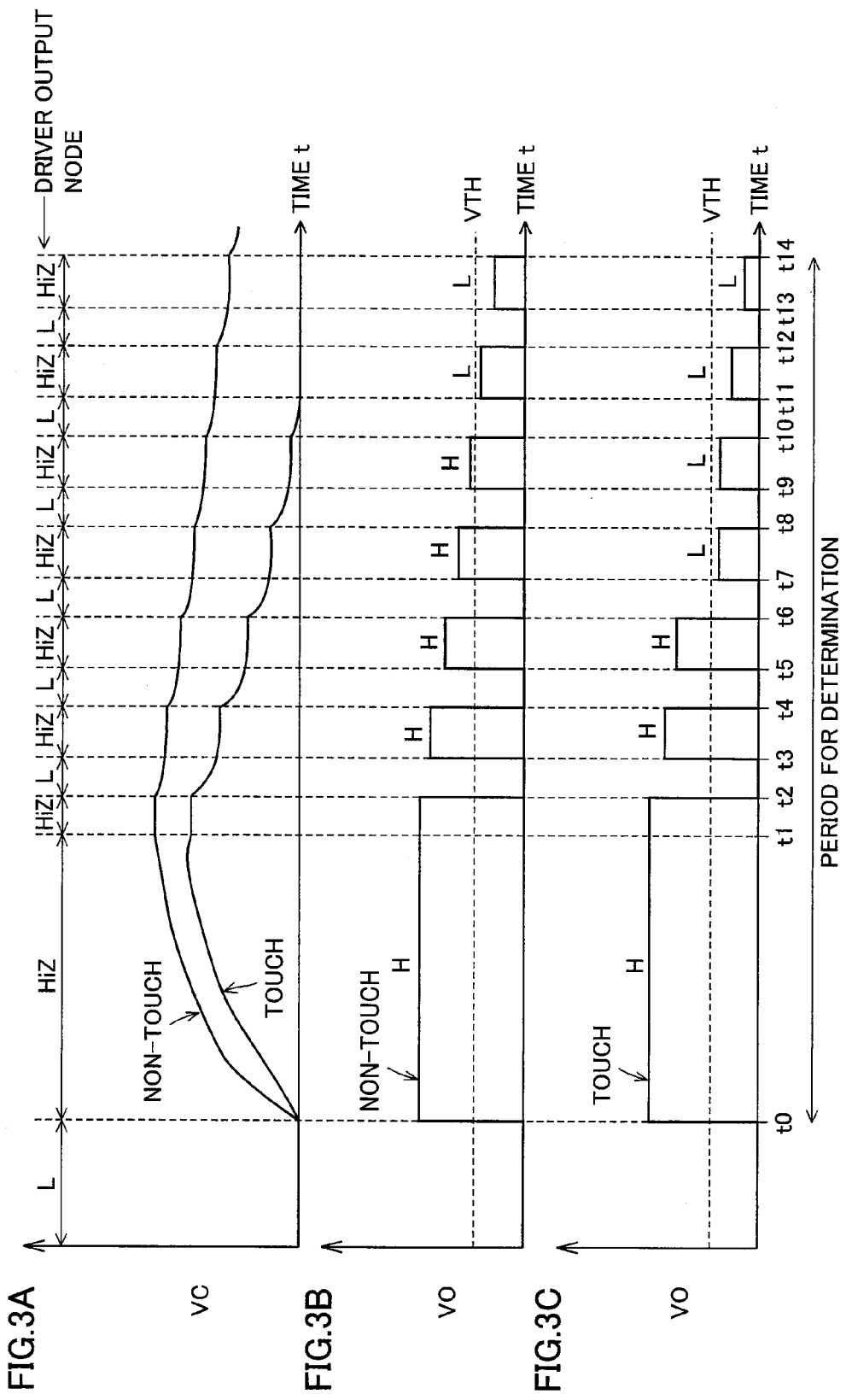
FIGS. 3A to 3C are each a time chart illustrating an operation of the touch sensor shown in FIG. 1.

FIGS. 3A to 3C are each a time chart illustrating an operation of touch sensor 101. FIG. 3A shows a change of voltage VC of external terminal TA1 (namely a voltage across capacitor 6) with time, FIG. 3B shows a change of voltage VO of external terminal TA3 with time in the case where touch electrode EL is not touched by a human body and FIG. 3C shows a change of voltage VO of external terminal TA3 with time in the case where touch electrode EL is touched by a human body.

In the following, an operation of control circuit 5 will be described with reference to FIGS. 3A to 3C. In the initial state, drivers 2 to 4 all output "L" level, switches SA1 to SA3 and SB1 to SBn are turned on and external terminals TA1 to TA3 and TB1 to TBn are reset to "L" level.

At time t0, microcomputer 9 makes a request to sense to control circuit 5. Then, control circuit 5 turns off switches SA2, SB2 to SBn, namely the switches except for switches SA1, SA3, SB1 to connect touch electrode EL1 to external terminal TA3, and controls drivers 2 to 4 so that respective output nodes (external terminals TA2 and TA3) of drivers 3 and 4 are set to the HiZ state and external terminal TA1 is set to "H" level. Accordingly, current flows into capacitors 6, 8, CX1, and voltage VC of external terminal TA1 increases.

Capacitance CT1 of touch electrode EL1 when touched by a human body is larger than capacitance CT2 of touch electrode EL1 when not touched by a human body (CT1>CT2). Therefore, the rate of increase of voltage VC in the case where a human body touches touch electrode EL1 is slower than the rate of increase thereof in the case where a human body does not touch this touch electrode EL1.

Next, at time t1, control circuit 5 turns off switch SA1 to set respective output nodes of drivers 2 to 4 to the HiZ state and stop charging capacitors 6, 8, CX1 (time from t0 to t1: charge period).

Next, at time 2 (time from t2 to t3: discharge period), control circuit 5 controls drivers 2 to 4 to keep the output node (external terminal TA1) of driver 2 in the HiZ state, and set external terminals TA2, TA3 to "L" level. Accordingly, a part of the charge stored in capacitor 6 flows from capacitor 6 via resistor element 7 and external terminal TA2 to driver 3, voltage VC of external terminal TA1 decreases and the charge stored in capacitors 8, CX1 is released.

Next, at time t3 (time from t3 to t4: measurement period), control circuit 5 controls drivers 2 to 4 to keep the output node of driver 2 in the HiZ state and set respective output nodes of drivers 3 and 4 to the HiZ state. Accordingly, a part of the charge stored in capacitor 6 is distributed via resistor element 7 to capacitors 8, CX1, voltage VC of external terminal TA1 decreases and voltage VO of external terminal TA3 increases (charge distribution period). Since capacitance CT1 of touch electrode EL1 while a human body touches touch electrode EL1 is larger than capacitance CT2 of touch electrode EL1 while a human body does not touch this touch electrode EL1 (CT1>CT2), voltage VO while a human body touches touch electrode EL1 is lower than voltage VO while a human body does not touch this touch electrode EL1. Further, since a part of the charge stored in capacitor 6 is released via resistor element 7 in the period from time t2 to time t3, the level of voltage VO is lower than that in the period from time t0 to time t1.

When a predetermined time has elapsed since control circuit 5 set the output nodes of drivers 2 to 4 to the HiZ state, control circuit 5 compares the level of voltage VO of external terminal TA3 with the level of threshold voltage VTH. Control circuit 5 determines that voltage VO is "H" level when the relation VO>VTH holds, and determines that voltage VO is "L" level when the relation VO<VTH holds (measuring operation). Threshold voltage VTH is a voltage between ground voltage GND and power supply voltage VCC (threshold voltage: VCC/2 for example). In the period from time t3 to time t4 in FIGS. 3A to 3C, the relation VO>VTH holds all the time regardless the presence or absence of a touch, and therefore control circuit 5 determines that voltage VO is "H" level.

When control circuit 5 determines that voltage VO is "H level", control circuit 5 increments (+1) the count of "H" level. When control circuit 5 determines that voltage VO is "L" level, control circuit 5 increments (+1) the count of "L" level. In the period from time t3 to time t4 in FIGS. 3A to 3C, the relation VO>VTH holds all the time regardless of the presence or absence of a touch, and thus control circuit 5 increments (+1) the count of "H" level.

Subsequently, control circuit 5 alternately repeats the discharge period and the measurement period. In the discharge period, external terminals TA2, TA3 are set to "L" level to release a part of the charge of capacitor 6 and the charge of capacitors 8, CX1. In the measurement period, external terminals TA2, TA3 are set to the HiZ state to distribute a part of the charge of capacitor 6 to capacitors 8, CX1, and a comparison is made between respective levels of voltage VO of external capacitor TA3 and threshold voltage VTH.

FIGS. 3A to 3C illustrate, by way of example, a case where the discharge period and the measurement period are each repeated six times after the charging operation (from time t0 to time t1). In the case where touch electrode EL1 is not touched by a human body (non-touch), it is determined four times that voltage VO is "H" level and it is determined twice that voltage VO is "L" level. In the case where touch electrode EL1 is touched by a human body (touch), it is determined twice that voltage VO is "H" level and it is determined four times that voltage VO is "L" level.

When the number of times it is determined that voltage VO is "H" level is more than three, control circuit 5 determines that touch electrode EL1 is not touched by a human body. When the number of times it is determined that voltage VO is "H" level is less than three, control circuit 5 determines that touch electrode EL1 is touched by a human body.

Control circuit 5 selects remaining touch electrodes EL2 to ELn one by one successively, and makes a determination as to whether each touch electrode EL is touched by a human body or generates data for making the determination, in a similar manner to the one for touch electrode EL1. Control circuit 5 outputs, to microcomputer 9, a signal indicating whether each touch electrode EL is touched by a human body or a signal indicating the fact that the data for making the determination has been generated. Alternatively, only when it is determined that touch electrode EL is touched by a human body, a signal indicating this touch electrode EL may be output to microcomputer 9.

Figure 4:
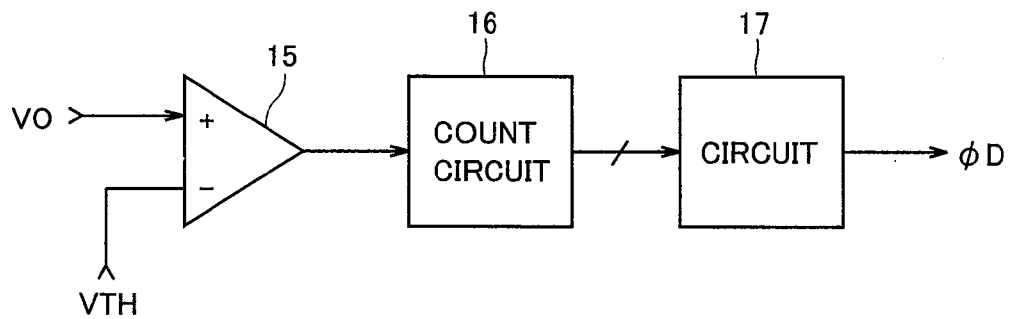
FIG. 4 is a block diagram illustrating main components of a control circuit shown in FIG. 1.

FIG. 4 is a block diagram illustrating main components of control circuit 5. In FIG. 4, control circuit 5 includes a comparison circuit 15, a count circuit 16 and a circuit 17. Comparison circuit 15 makes a comparison between respective levels of voltage VO of external terminal TA3 and threshold voltage VTH in a measurement period, and outputs a signal indicating the result of the comparison. Count circuit 16 counts the number of times "H" level is sensed and the number of times "L" level is sensed, based on the output signal of comparison circuit 15. Circuit 17 determines whether touch electrode EL is touched by a human body, based on the count value of count circuit 16, and outputs a signal indicating the result of the determination. Count circuit 16 is reset each time the determination for one touch electrode EL as to whether this touch electrode is touched has been made.

Figure 5:
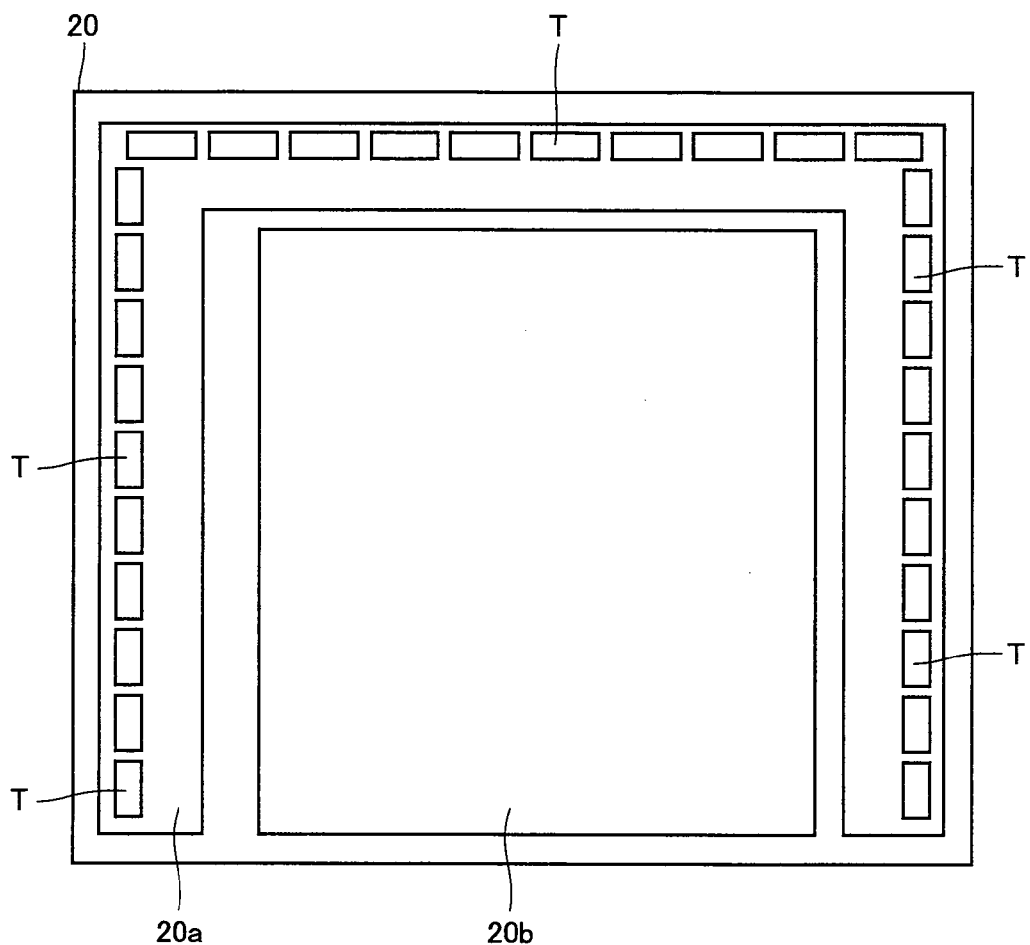
FIG. 5 illustrates a layout of a touch sensor IC shown in FIG. 1.

FIG. 5 shows a layout of touch sensor IC 1. Touch sensor IC 1 in FIG. 5 includes a semiconductor substrate 20. A surface of semiconductor substrate 20 is divided into two sections, namely an analog region 20a and a digital region 20b. In FIG. 5, a substantially inverted-U-shaped region along the three sides of the rectangular surface of semiconductor substrate 20 is defined as analog region 20a, and the residual rectangular region is defined as digital region 20b. An analog circuit portion of IC 1 is disposed in analog region 20a and a digital circuit portion of IC 1 is disposed in digital region 20b.

The analog circuit portion includes a plurality of external terminals T (TA1 to TA3, TB1 to TBn, TC1 to TCm), drivers 2 to 4 and switches SA1 to SA3, SB1 to SBn. The digital circuit portion includes control circuit 5. The analog circuit portion and the digital circuit portion are arranged in separate regions in this way, and accordingly the adverse influence of noise generated due to clock or the like in the digital circuit portion, on the analog circuit portion, can be suppressed. Analog region 20a and digital region 20b may be physically separated from each other and a guard region may be provided between the analog and digital regions, so as to reduce noise by using the guard region and provide separate power supplies for the analog and digital regions.

As seen from above, in the first embodiment of the present invention, switches SA3, SB1 to SBn are provided for connecting, to external terminal TA3 with its voltage to be sensed, external terminal TB selected from a plurality of external terminals TB1 to TBn connected to a plurality of touch electrodes EL1 to ELn, respectively. Therefore, only one set of two capacitors 6, 8 and resistor element 7 is enough for a plurality of touch electrodes EL1 to ELn. The number of components of the touch sensor is thus smaller than that of the conventional sensor provided with two capacitors 6, 8 and resistor element 7 for each touch electrode EL. In this way, the touch sensor can be reduced in size and price, the influence of difference between respective characteristics of externally-mounted components can be suppressed, and the number of external terminals T of touch sensor IC 1 can be reduced.

Further, control circuit 5 that controls touch sensor IC 1 and determines whether touch electrode EL is touched by a human body is provided within touch sensor IC 1. Therefore, as compared with the conventional touch sensor where a microcomputer controls the touch sensor IC and determines whether touch electrode EL is touched by a human body, the load on microcomputer 9 is lessened. Accordingly, while the CPU of microcomputer 9 is stopping, whether touch electrode EL is touched by a human body can be determined. The power consumption can thus be reduced.

In the first embodiment, control circuit 5 determines whether touch electrode EL is touched by a human body. Alternatively, control circuit 5 may output, to microcomputer 9, a signal with which whether touch electrode EL is touched by a human body can be determined, and then microcomputer 9 may determine whether touch electrode EL is touched by a human body. For example, circuit 17 of FIG. 4 may be removed and an output signal of count circuit 16 may be output to microcomputer 9 for use as a signal based on which whether touch electrode EL is touched by a human body can be determined.

Second Embodiment

FIGS. 3A to 3C illustrate the state where the level of voltage VO is constant in the periods indicated by HiZ, namely the measurement periods in which respective output nodes of drivers 2 to 4 are set to the HiZ state and voltage VO is measured. If noise is generated in the measurement periods, however, voltage VO could vary and an erroneous measurement could be obtained in some cases.

In view of this, a touch sensor according to a second embodiment senses a touch in the following manner.

Specifically, control circuit 5 controls drivers 2 to 4 so that capacitor 6 is charged. After this, control circuit 5 controls drivers 2 to 4 so that the above-described discharge period and the above-described measurement period are repeated alternately, performs a measuring operation by making a comparison between the voltage level of external terminal TA3 and threshold voltage VTH multiple times in one measurement period, and determines whether touch electrode EL is touched by a human body, based on the results of comparisons. Then, based on respective results of comparisons in a plurality of measurement periods, control circuit 5 determines whether touch electrode EL is touched by a human body.

Figure 6:
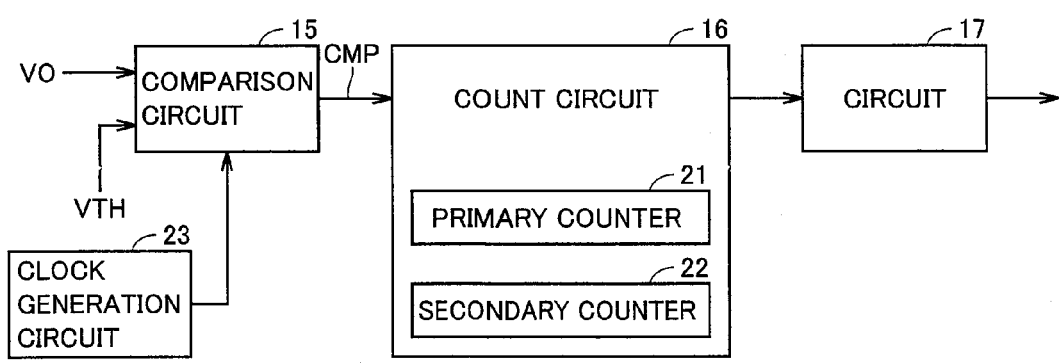
FIG. 6 is a block diagram illustrating main components of a control circuit of a touch sensor according to a second embodiment of the present invention.

FIG. 6 is a block diagram illustrating main components of control circuit 5. Referring to FIG. 6, control circuit 5 includes a comparison circuit 15, a count circuit 16, a circuit 17 and a clock generation circuit 23.

Clock generation circuit 23 generates a count clock having a period of less than a half of the measurement period, and outputs the count clock to comparison circuit 15.

In the measurement period, comparison circuit 15 makes a comparison between respective levels of voltage VO of external terminal TA3 and threshold voltage VTH following the timing of the count clock received from clock generation circuit 23, and outputs signal CMP indicating the result of the comparison.

Count circuit 16 includes a primary counter 21 and a secondary counter 22 and, based on signal CMP received from comparison circuit 15, counts the number of times it is determined that voltage VO is "H" level and the number of times it is determined that voltage VO is "L" level. Circuit 17 determines whether touch electrode EL is touched by a human body, based on the count value of count circuit 16, and outputs a signal indicating the result of the determination or generates data for making the determination. Each time the determination is made for one touch electrode EL as to whether this touch electrode EL is touched, or each time generation of the data for making the determination is completed, count circuit 16 is reset.

Figure 7:
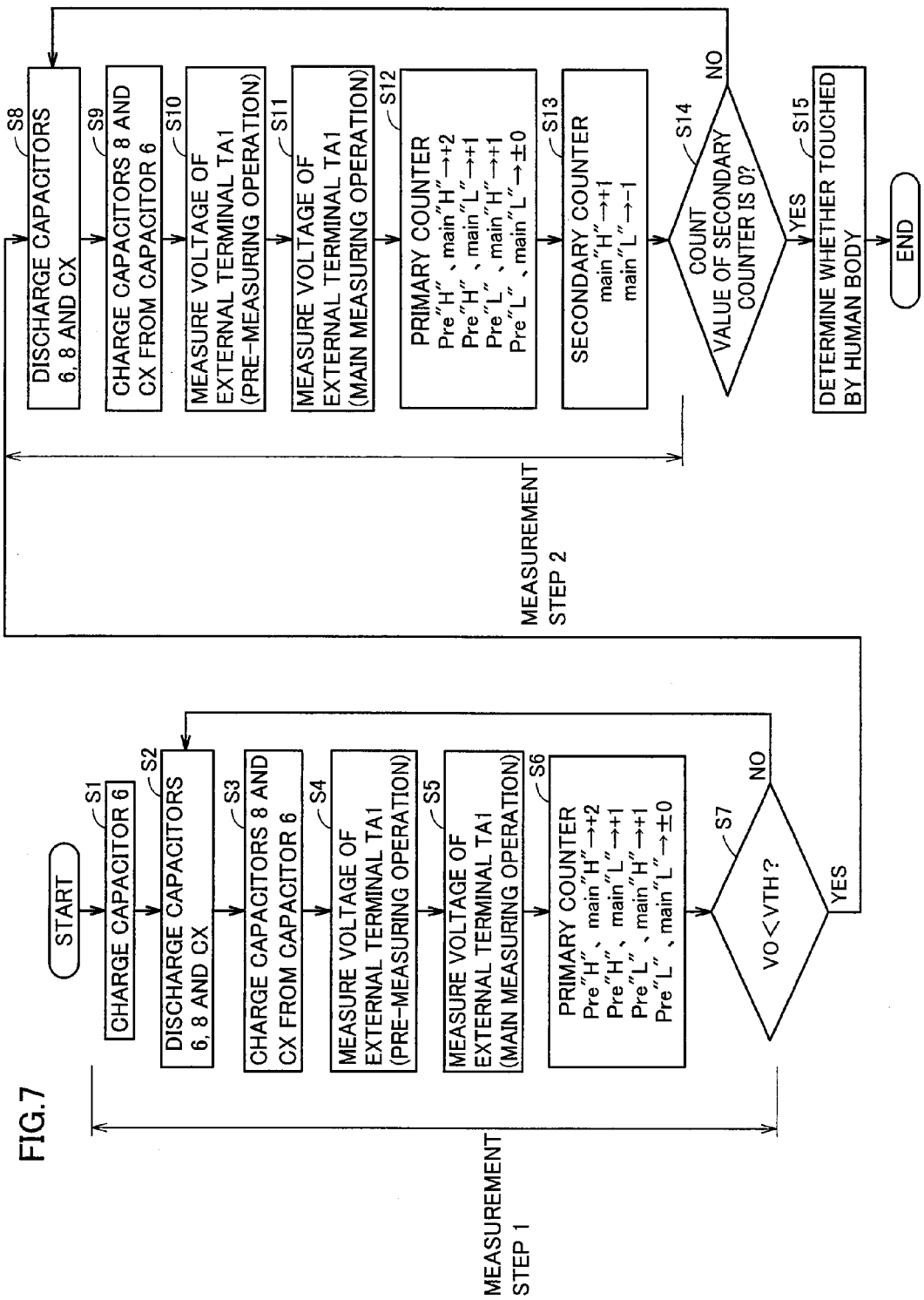
FIG. 7 is a flowchart specifying an operational procedure for sensing a touch by the touch sensor including the control circuit shown in FIG. 6.

FIG. 7 is a flowchart specifying an operational procedure for the touch sensor in the second embodiment of the present invention to sense a touch. FIG. 8 is a waveform chart illustrating a voltage determining operation of the touch sensor in the second embodiment of the present invention. In FIG. 8, a voltage level of external terminals TA2, TA3 is shown. FIGS. 9A and 9B illustrate a counting operation of primary counter 21 and secondary counter 22 in a control circuit in the second embodiment of the present invention.

Referring to FIGS. 7, 8, 9A, and 9B, control circuit 5 first performs each operation in a measurement step 1. In measurement step 1, control circuit 5 first charges capacitor 6 to power supply voltage VCC (step S1: charge period).

Next, in a discharge period shown in FIG. 8, control circuit 5 sets respective output nodes of drivers 3 and 4 to "L" level to release a part of the charge stored in capacitor 6 as well as the charge stored in capacitors 8, CX1 (step S2: discharge period).

Then, in a measurement period shown in FIG. 8, control circuit 5 sets respective output nodes of drivers 3 and 4 to the HiZ state to distribute a part of the charge stored in capacitor 6 to capacitors 8, CX1 (step S3: charge distribution period).

Further, when a predetermined time has elapsed from the start of the measurement period, control circuit 5 performs a pre-measuring operation by making a comparison between respective levels of voltage VO of external terminal TA3 and threshold voltage VTH (step S4).

Furthermore, in the same measurement period as step S4, control circuit 5 performs a main measuring operation by making a comparison between respective levels of voltage VO of external terminal TA3 and threshold voltage VTH when a predetermined time has elapsed since the pre-measuring operation was performed (step S5). Here, "pre" and "main" preceding "measuring operation" are prefixes for identifying the measuring operation performed first and the measuring operation performed next in one measurement period.

In the case where the result of determination in the pre-measuring operation is "H" level and the result of determination in the main measuring operation is "H" level, primary counter 21 adds two to the count value. In the case where the result of determination in the pre-measuring operation is "H" level and the result of determination in the main measuring operation is "L" level and in the case where the result of determination in the pre-measuring operation is "L" level and the result of determination in the main measuring operation is "H" level, primary counter 21 adds one to the count value. In the case where the result of determination in the pre-measuring operation is "L" level and the result of determination in the main measuring operation is "L" level, primary counter 21 does not update the count value (step S6). The initial count value of primary counter 21 is zero for example.

Next, in the case where at least one of respective results of determinations in the pre-measuring operation and the main measuring operation is "H" level (NO in step S7), control circuit 5 performs the operations in steps S2 to S6 again. When the measuring operation is performed three or more times in one measurement period, the operations in steps S2 to S6 are repeated in the case where "H" level is sensed a predetermined number of times or more (the predetermined number is not less than one).

In the case where the result of determination in the pre-measuring operation is "L" level and the result of determination in the main measuring operation is "L" level (YES in step S7), control circuit 5 proceeds to a measurement step 2. When the measuring operation is performed three or more times in one measurement period, the operations in steps S2 to S6 are repeated in the case where "H" level is sensed zero time or less than a predetermined number of times (the predetermined number is not less than one).

In measurement step 2, control circuit 5 first sets respective output nodes of drivers 3 and 4 to "L" level to release a part of the charge stored in capacitor 6 and the charge stored in capacitors 8, CX1 in the discharge period shown in FIG. 8 (step S8: discharge period).

Next, in the measurement period shown in FIG. 8, control circuit 5 sets respective output nodes of drivers 3 and 4 to the HiZ state to distribute a part of the charge stored in capacitor 6 to capacitors 8, CX1 (step S9: charge distribution period).

Further, when a predetermined time has elapsed from the start of this measurement period, control circuit 5 performs a pre-measuring operation by making a comparison between respective levels of voltage VO of external terminal TA3 and threshold voltage VTH (step S10).

Furthermore, in the same measurement period as step S10, control circuit 5 performs a main measuring operation by making a comparison again between respective levels of voltage VO of external terminal TA3 and threshold voltage VTH when a predetermined time has elapsed since the pre-measuring operation was performed (step S11).

Primary counter 21 updates the count value based on the result of determination in the pre-measuring operation and the result of determination in the main measuring operation (step S12). The rule for update of the count value is similar to step S6.

Then, in the case where the result of determination in the main measuring operation in step S11 is "H" level, secondary counter 22 adds one to the count value. In the case where the result of determination in the main measuring operation in step S11 is "L" level, secondary counter 22 subtracts one from the count value (step S13). The initial count value of secondary counter 22 is an integer of not less than one, and the count value set here will not exceed the initial value.

Next, in the case where the count value of secondary counter 22 is not zero (NO in step S14), control circuit 5 performs the operations in steps S8 to S13 again. When the measuring operation is performed three or more times in one measurement period, the operations in steps S8 to S13 are repeated in the case where the count value is a predetermined value or more (the predetermined value is not less than one).

In contrast, in the case where the count value of secondary counter 22 is zero (YES in step S14), control circuit 5 makes a determination as to whether touch electrode EL is touched by a human body, based on the count value of primary counter 21, or generates data for making the determination (step S15). When the measuring operation is performed three or more times in one measurement period, the operations in steps S8 to S13 are repeated in the case where the count value is zero, or less than a predetermined value of not less than one.

FIGS. 10A and 10B illustrate an example of the measuring operation by the control circuit of the touch sensor in the second embodiment of the present invention. In FIGS. 10A and 10B, the count source is a count clock that is output by clock generation circuit 23. The initial value of primary counter 21 is n and the initial value of secondary counter 22 is m.

Referring to FIGS. 10A and 10B, the pre-measuring operation in the first measurement period determines that voltage VO is "H" level, and thus the count value of primary counter 21 is n+1. Further, the main measuring operation in the first measurement period determines that voltage VO is "H" level, and thus the count value of primary counter 21 is n+2.

Next, because the pre-measuring operation in the second measurement period determines that voltage VO is "H" level, the count value of primary counter 21 is n+3. Further, because the main measuring operation in the second measurement period determines that voltage VO is "L" level, the count value of primary counter 21 is not updated.

Next, because the pre-measuring operation in the third measurement period determines that voltage VO is "L" level, the count value of primary counter 21 is not updated. Further, because the main measuring operation in the third measurement period determines that voltage VO is "H" level, the count value of primary counter 21 is n+4.

After this, the operation is performed in a similar manner. When the pre-measuring operation and main measuring operation in the sixth measurement period are completed, the count value of primary counter 21 is n+9.

Next, when the pre-measuring operation and main measuring operation in the seventh measurement period both determine that voltage VO is "L" level, control circuit 5 proceeds to measurement step 2. In this period of measurement step 1, the count value of secondary counter 22 remains the same.

Next, because the pre-measuring operation and main measuring operation in the eighth measurement period determine that voltage VO is "L" level, the count value of primary counter 21 is not updated and the count value of secondary counter 22 is m−1.

Next, because the pre-measuring operation in the ninth measurement period determines that voltage VO is "H" level, the count value of primary counter 21 is n+10. Then, the main measuring operation in the ninth measurement period determines that voltage VO is "L" level, the count value of primary counter 21 is not updated and the count value of secondary counter 22 is m−2.

Next, because the pre-measuring operation in the tenth measurement period determines that voltage VO is "L" level, the count value of primary counter 21 is not updated. Further, because the main measuring operation in the tenth measurement period determines that voltage VO is "H" level, the count value of primary counter 21 is n+11 and the count value of secondary counter 22 is m−1.

In other words, regarding control circuit 5 in the second embodiment of the present invention, if low-frequency noise is generated from a human body, voltage VO is influenced by a positive voltage or a negative voltage of approximately the same level due to noise, in both of the pre-measuring operation and main measuring operation. Therefore, even when voltage VO is almost equal to threshold voltage VTH, respective results of determinations in the pre-measuring operation and the main measuring operation are likely to be the same, and the influence of noise can be suppressed. If high-frequency noise is generated, although one of the pre-measuring operation and the main measuring operation determines that voltage VO is "L" level in the second and third measurement periods, the measurement step is prevented from erroneously proceeding to measurement step 2.

As seen from above, regarding the touch sensor in the second embodiment of the present invention, control circuit 5 makes a comparison multiple times between the voltage level of external terminal TA3 and threshold voltage VTH in each measurement period, and determines whether or not touch electrode EL is touched by a human body, based on the results of comparisons in each measurement period. Specifically, the determination about the level of voltage VO is made twice in total in one measurement period and, based on the results of the level determinations, it is determined whether touch electrode EL is touched by a human body. Even when noise is generated in the measurement period and any result of determination is in error, erroneous sensing can be suppressed and accordingly whether a touch electrode is touched by a human body can be appropriately determined.

Another embodiment of the present invention will now be described with reference to the drawings. In the drawings, the same or corresponding components are denoted by the same reference characters, and the description thereof will not be repeated.

Third Embodiment

The present embodiment relates to a touch sensor for which the timing of making a determination about the level of voltage VO is variable, in contrast to the touch sensor in the second embodiment. The touch sensor in the present embodiment is similar to the touch sensor in the second embodiment except for the details given below.

Figure 11:
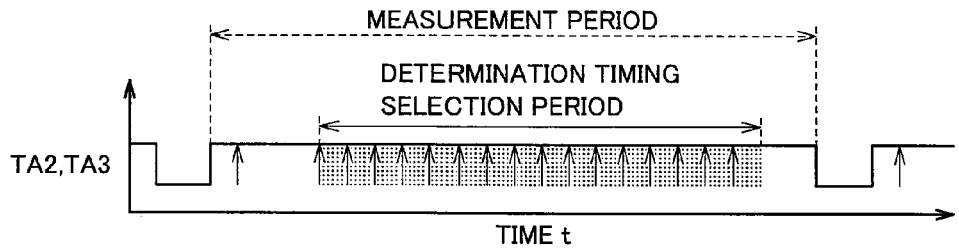
FIG. 11 illustrates a voltage determining operation of a touch sensor according to a third embodiment of the present invention.
Figure 12:
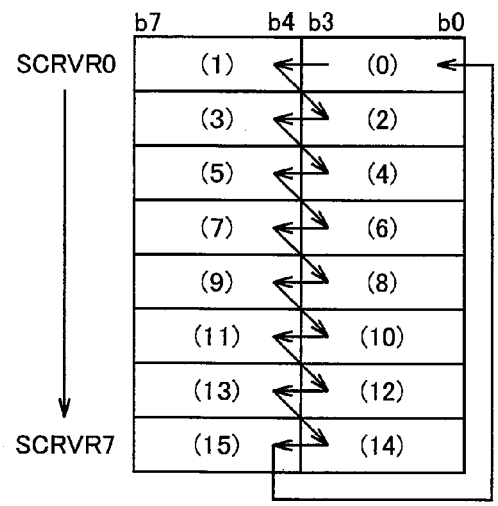
FIG. 12 illustrates a determination timing storage register included in the touch sensor as described with FIG. 11.

FIG. 11 illustrates a voltage determining operation of the touch sensor in the third embodiment of the present invention. FIG. 12 illustrates a determination timing storage register in a control circuit in the third embodiment of the present invention.

Control circuit 5 can select, for each measurement period, one of a plurality of edges of a count clock in the measurement period. In one or both of a pre-measuring operation and a main measuring operation, control circuit 5 makes a comparison between the voltage level of external terminal TA3 and threshold voltage VTH following the timing of the selected edge.

More specifically, referring to FIGS. 11 and 12, the determination timing storage register stores set values SCRVR0 to SCRVR7. Set values SCRVR0 to SCRVR7 each have a data length of eight bits. Based on set values SCRVR0 to SCRVR7, control circuit 5 determines at which determination timing in each measurement period a determination about the level of voltage VO should be made. Set values SCRVR0 to SCRVR7 can be changed by user's setting or the like.

For example, comparison circuit 15 of control circuit 5 defines a determination timing selection period having a length corresponding to 16 periods of the count clock in the measurement period, and selects one of the 16 rising edges of the count clock in the determination timing selection period, for use as the timing at which a determination about voltage VO is to be made. Comparison circuit 15 may be configured so that the determination timing is variable for both of the pre-measuring operation and main measuring operation, or the determination timing is variable for one of the pre-measuring operation and main measuring operation. Further, the pre-measuring operation and the main measuring operation in the same measurement period may use respective set values SCRVR different from each other.

Comparison circuit 15 measures voltage VO at the timing represented by the lower four bits of set value SCRVR0 in a measurement period, measures voltage VO at the timing represented by the upper four bits of set value SCRVR0 in the subsequent measurement period, and measures voltage VO at the timing represented by the lower four bits of set value SCRVR1 in the subsequent measurement period. After measuring the voltage in a similar manner, comparison circuit 15 measures voltage VO at the timing represented by the upper four bits of set value SCRVR7 in a measurement period, and thereafter measures voltage VO at the timing represented by the lower four bits of set value SCRVR0 again in the subsequent measurement period.

In this way, control circuit 5 of the touch sensor in the third embodiment of the present invention makes a comparison between the voltage level of external terminal TA3 and threshold voltage VTH when a predetermined time has elapsed from the start of a measurement period, and the predetermined time is different from one measurement period to another. Namely, the timing at which a determination about the level of voltage VO is made in a measurement period is different from that in another measurement period. Accordingly, the influence of noise generated at certain intervals can be lessened and whether a touch electrode is touched by a human body can be appropriately determined.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Fourth Embodiment

The present embodiment relates to a touch sensor for which the timing of making a determination about the level of voltage VO is variable, in contrast to the touch sensor in the second embodiment. The touch sensor in the present embodiment is similar to the touch sensor in the second embodiment except for the details given below.

Figure 13:
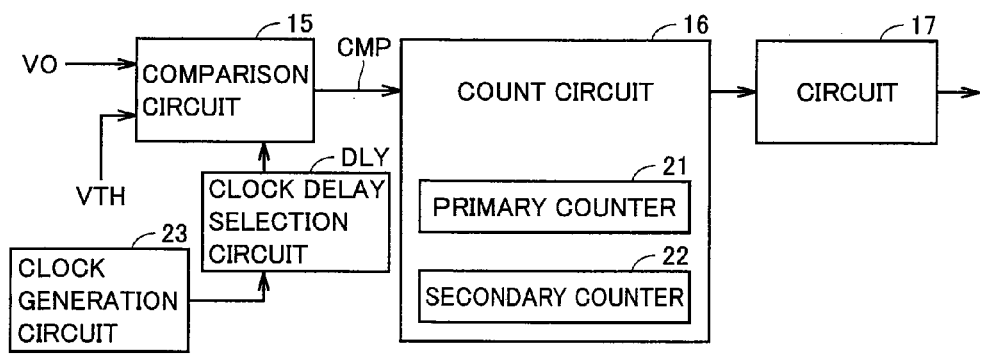
FIG. 13 is a block diagram illustrating a configuration of a control circuit of a touch sensor according to a fourth embodiment of the present invention.

FIG. 13 illustrates a configuration of a control circuit 5 of the touch sensor in the fourth embodiment of the present invention. Referring to FIG. 13, control circuit 5 further includes a clock delay selection circuit DLY in addition to the components of the control circuit in the second embodiment of the present invention.

Figure 14:
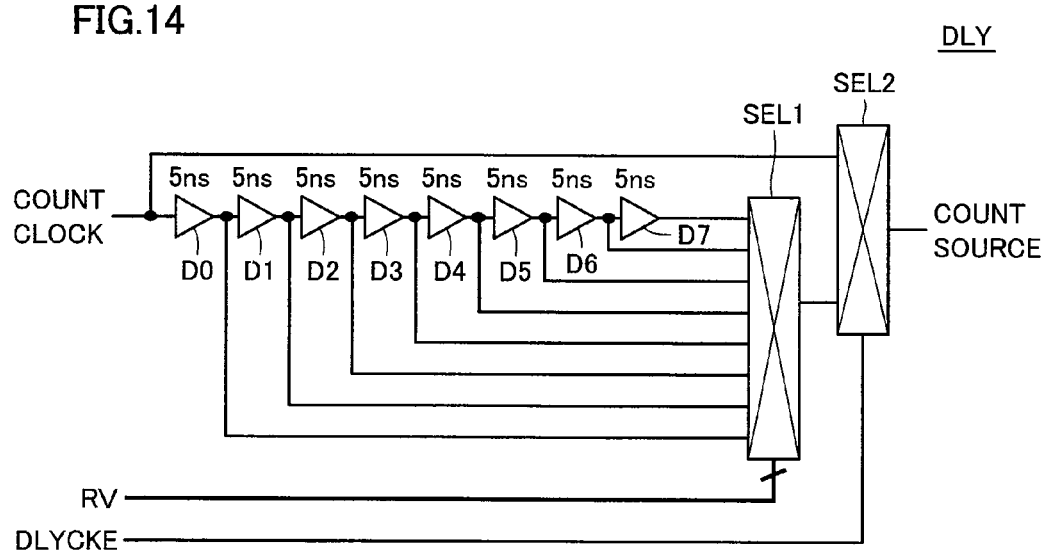
FIG. 14 illustrates a configuration of a clock delay selection circuit shown in FIG. 13.

FIG. 14 illustrates a configuration of clock delay selection circuit DLY. Referring to FIG. 14, clock delay selection circuit DLY includes delay elements D0 to D7 and selectors SEL1, SEL2.

Delay elements D0 to D7 each delay a received signal by a time that is less than a half period of the count clock. Delay elements D0 to D7 are connected in series. Delay element D0 delays the count clock received from clock generation circuit 23 by a predetermined time and outputs the delayed count clock. Delay elements D1 to D7 delay respective count clocks received from delay elements D0 to D6 by a predetermined time, and output the delayed count clocks, respectively. The delay time of delay elements D0 to D7 is 5 ns for example.

For each measurement period, control circuit 5 can select one of the signals that are output respectively from a plurality of delay elements D0 to D7, and makes a comparison between the voltage level of external terminal TA3 and threshold voltage VTH following the timing of the selected signal.

Specifically, based on timing setting signal RV generated by control circuit 5, selector SEL1 selects one of the count clocks received from delay elements D0 to D7 and outputs the selected one to selector SEL2. Timing setting signal RV is generated for example based on a value stored in a determination timing storage register similar to the one shown in FIG. 12.

Based on delay enable signal DLYCKE generated by control circuit 5, selector SEL2 outputs one of the count clock received from clock generation circuit 23 and the count clock received from selector SEL1, for use as the count source.

Comparison circuit 15 of control circuit 5 makes a determination about the level of voltage VO following the timing of the count source received from clock delay selection circuit DLY.

Figure 15:
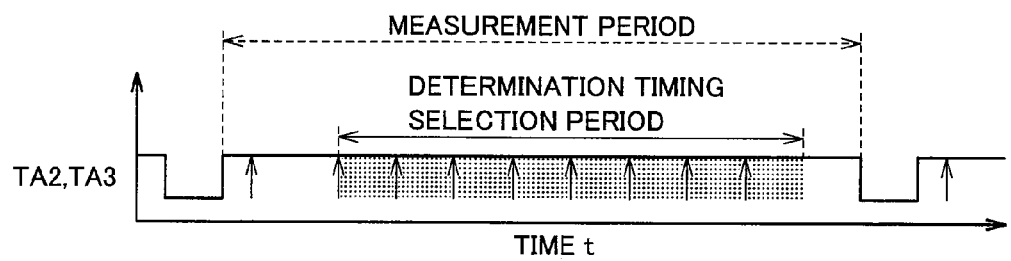
FIG. 15 illustrates a voltage determining operation of the touch sensor including the control circuit shown in FIG. 13.

FIG. 15 illustrates a voltage determining operation of the touch sensor in the fourth embodiment of the present invention.

Referring to FIG. 15, the control circuit in the fourth embodiment of the present invention makes a determination about the level of voltage VO, based on one of eight count clocks in the determination timing selection period defined by clock delay selection circuit DLY. Control circuit 5 may use different count clocks for the pre-measuring operation and main measuring operation in the same measurement period, for use as the count source.

FIGS. 16A and 16B illustrate an example of the measuring operation by control circuit 5 of the touch sensor in the fourth embodiment of the present invention. In FIGS. 16A and 16B, a case is illustrated where control circuit 5 performs a main measuring operation and clock delay selection circuit DLY includes 16 delay elements for changing the timing at which the main measuring operation is performed by control circuit 5.

Referring to FIGS. 16A and 16B, according to a value represented by timing setting signal RV, the timing at which a determination about the level of voltage VO is made is changed. For example, timing setting signal RV is "2h" (h represents hexadecimal number) in the first measurement period and accordingly the determination about the level of voltage VO is made based on the timing of the clock that is output by the third delay element. In the third measurement period, timing setting signal RV is "Bh" and accordingly a determination about the level of voltage VO is made based on the timing of the clock that is output from the twelfth delay element.

In this way, control circuit 5 of the touch sensor in the fourth embodiment of the present invention makes a comparison between the voltage level of external terminal TA3 and threshold voltage VTH when a predetermined time has elapsed from the start of a measurement period, and the predetermined time is different from one measurement period to another. Namely, the timing at which a determination about the level of voltage VO is made in a measurement period is different from that in another measurement period. Accordingly, the influence of noise generated at certain intervals can be lessened and whether a touch electrode is touched by a human body can be appropriately determined.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Fifth Embodiment

The present embodiment relates to a touch sensor that differs from the touch sensor in the second embodiment in terms of the way to process the results of determination about the level. Except for details described below, the touch sensor in the present embodiment is similar to the touch sensor in the second embodiment.

Figure 17A:
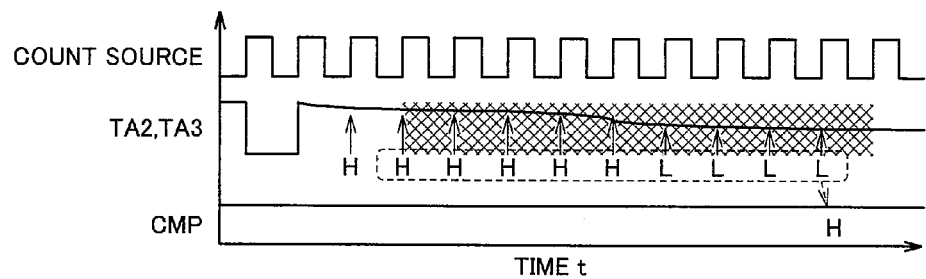
FIGS. 17A and 17B illustrate a method for processing results of determination about the level of voltage VO in a control circuit of a touch sensor according to a fifth embodiment of the present invention.
Figure 17B:
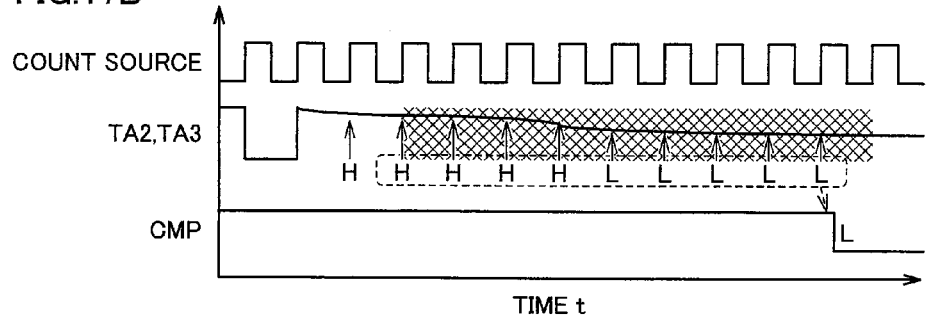

FIGS. 17A and 17B illustrate how to process the results of determination about the level of voltage VO by a control circuit of the touch sensor in the fifth embodiment of the present invention.

Referring to FIGS. 17A and 17B, control circuit 5 makes multiple comparisons between the voltage level of external terminal TA3 and threshold voltage VTH in a measurement period, determines which of the voltage level of external terminal TA3 and threshold voltage VTH is larger or smaller in the measurement period by applying the majority rule to respective results of the multiple comparisons, and determines whether touch electrode EL is touched by a human body based on the result of the majority-based determination in each measurement period.

For example, comparison circuit 15 in control circuit 5 performs, ten times in one measurement period, a determining operation by making a comparison between respective levels of voltage VO of external terminal TA3 and threshold voltage VTH, applies the majority rule to the latest nine results of the determination about the level, out of the ten results, and outputs signal CMP representing the result of the majority-based determination. The number of times the determining operation about the level is made to provide respective results to which the majority rule is applied, may be changed by user's setting or the like.

Referring to FIG. 17A, out of nine determinations as to whether voltage VO is "H" level or "L" level, five determinations are "H" level and four determinations are "L" level. In this case, comparison circuit 15 outputs signal CMP of "H" level.

Referring to FIG. 17B, out of nine determinations about the level of voltage VO, four determinations are "H" level and five determinations are "L" level. In this case, comparison circuit 15 outputs signal CMP of "L" level.

FIGS. 18A and 18B illustrate an example of the measuring operation by the control circuit of the touch sensor in the fifth embodiment of the present invention.

Referring to FIGS. 18A and 18B, comparison circuit 15 in control circuit 5 performs, seven times in one measurement period, the determining operation by making a comparison between respective levels of voltage VO of external terminal TA3 and threshold voltage VTH, applies the majority rule to respective results of the seven level determinations, and outputs signal CMP representing the result of the majority-based determination.

For example, in the first measurement period, the number of "H" level determinations out of the seven level determinations is larger. Comparison circuit 15 therefore outputs signal CMP of "H" level. Primary counter 21 in count circuit 16 receives signal CMP of "H" level from comparison circuit 15 and accordingly updates the count value from the initial value of n to n+1.

In the fifth measurement period, the number of "L" level determinations out of the seven level determinations is larger. Comparison circuit 15 therefore outputs signal CMP of "L" level. Then, control circuit 5 proceeds to measurement step 2.

In the sixth measurement period, the number of "L" level determinations out of the seven level determinations is larger. Comparison circuit 15 therefore outputs signal CMP of "L" level. In response to this, the count value of primary counter 21 is not updated while the count value of secondary counter 22 is updated from the initial value of m to m−1.

In other words, control circuit 5 in the fifth embodiment of the present invention can prevent the measurement step from erroneously proceeding to measurement step 2, even when noise is generated in the first to fourth measurement periods and it is erroneously determined that voltage VO is "L" level.

As seen from above, control circuit 5 of the touch sensor in the fifth embodiment of the present invention makes multiple comparisons between the voltage level of external terminal TA3 and threshold voltage VTH in a measurement period, determines which of the voltage level of external terminal TA3 and threshold voltage VTH is larger or smaller in the measurement period by applying the majority rule to respective results of multiple comparisons, and determines whether touch electrode EL is touched by a human body based on the result of the majority-based determination in each measurement period. The present embodiment having the features as described above can suppress erroneous sensing even when the result of determination is in error due to noise generated in a measurement period, and can appropriately determine whether a touch electrode is touched by a human body.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Sixth Embodiment

The present embodiment relates to a touch sensor having an additional capability of controlling the length of a measurement period, in contrast to the touch sensor in the second embodiment. Except for details described below, the touch sensor in the present embodiment is similar to the touch sensor in the second embodiment.

Figure 19:
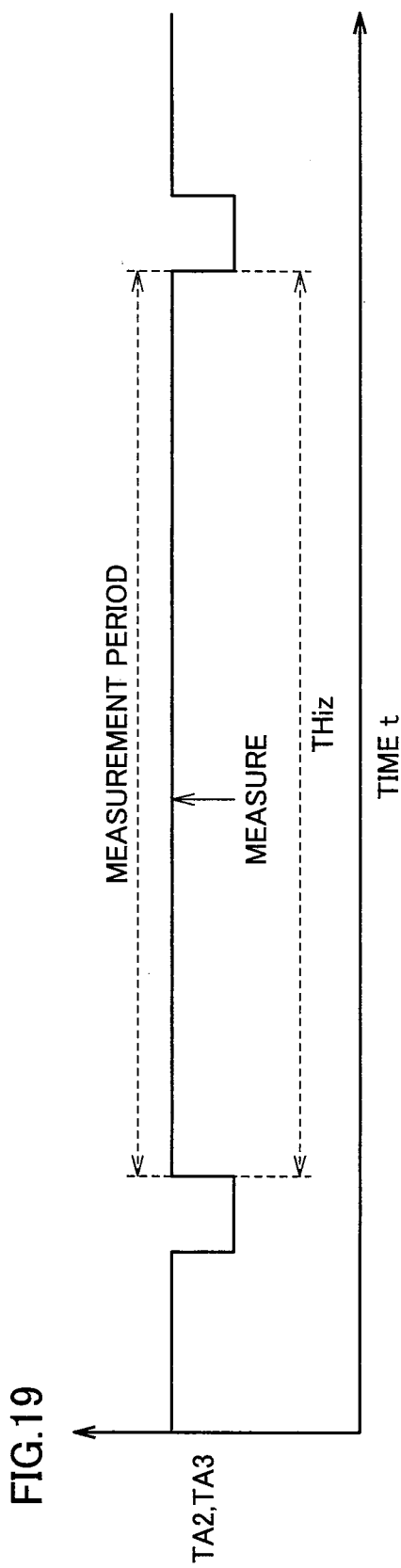
FIG. 19 is a waveform chart illustrating a voltage determining operation of a touch sensor according to a sixth embodiment of the present invention.

FIG. 19 is a waveform chart illustrating a voltage determining operation of the touch sensor in the sixth embodiment of the present invention.

Referring to FIG. 19, control circuit 5 can select one of an operation of controlling drivers 2 to 4 for making respective lengths of measurement periods equal to each other, and an operation of not performing control for making respective lengths of measurement periods equal to each other.

Specifically, as for the control circuits in the second to fifth embodiments, after the last level determining operation in a certain measurement period is performed, a predetermined ending process is performed, and then a discharging operation is started. Therefore, respective lengths of the measurement periods are different from each other depending on the timing at which the level determining operation is ended.

In contrast, as for the touch sensor in the sixth embodiment of the present invention, after the last level determining operation in a measurement period is performed, the timing at which the subsequent discharging operation is performed is controlled so that respective lengths of measurement periods are equal to the same length of THiz. In this way, erroneous determination due to noise with varying potential can be suppressed.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Seventh Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 20A and 20B illustrate an example of the measuring operation by control circuit 5 of the touch sensor in the seventh embodiment of the present invention.

Referring to FIGS. 20A and 20B, control circuit 5 performs the measuring operation in the second embodiment in which a pre-measuring operation and a main measuring operation are performed in one measurement period, and the measuring operation in the third embodiment in which one of a plurality of edges of a count clock in one measurement period is selected for use as the timing of making a determination about voltage VO. This control circuit 5, however, does not perform the measuring operation in the fourth embodiment in which a determination about voltage VO is made at the timing of one of count clocks received from a plurality of delay elements, the measuring operation in the fifth embodiment in which the majority rule is applied to respective results of level determinations, and the measuring operation in the sixth embodiment in which respective lengths of measurement periods are set equal to each other.

For example, control circuit 5 operates so that the timing at which a determination about voltage VO is made in a main measuring operation differs from one measurement period to another.

The present embodiment having the above-described features can further lessen the influence of noise and can appropriately determine whether a touch electrode is touched by a human body, as compared with the touch sensor in the second embodiment.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Eighth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 21A and 21B illustrate an example of the measuring operation by a control circuit of the touch sensor in the eighth embodiment of the present invention.

Referring to FIGS. 21A and 21B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, and the measuring operation in the fourth embodiment in which a determination about voltage VO is made at the timing of one of count clocks received from a plurality of delay elements. This control circuit 5, however, does not perform the measuring operation in the fifth embodiment in which the majority rule is applied to respective results of level determinations, and the measuring operation in the sixth embodiment in which respective lengths of measurement periods are set equal to each other.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the seventh embodiment.

Features and operations except for the above-described ones are similar to those of the touch sensor in the seventh embodiment, and the detailed description thereof will not be repeated.

A further embodiment of the present invention will now be described with reference to the drawings. In the drawings, the same or corresponding components are denoted by the same reference characters, and the description thereof will not be repeated.

Ninth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 22A and 22B illustrate an example of the measuring operation by a control circuit of the touch sensor in the ninth embodiment of the present invention.

Referring to FIGS. 22A and 22B, control circuit 5 performs the measuring operation in the second embodiment in which a pre-measuring operation and a main measuring operation are performed in one measurement period, and the measuring operation in the fifth embodiment in which the result of majority-based determination as to the level is obtained for use as a result of one main measuring operation. This control circuit 5, however, does not perform the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, and the measuring operation in the sixth embodiment in which respective lengths of measurement periods are set equal to each other.

For example, control circuit 5 applies the majority rule to respective results of determinations about the level in a main measuring operation.

The present embodiment having the above-described features can further lessen the influence of noise and appropriately determine whether a touch electrode is touched by a human body, as compared with the touch sensor in the seventh embodiment.

Features and operations except for the above-described ones are similar to those of the touch sensor in the seventh embodiment, and the detailed description thereof will not be repeated.

A further embodiment of the present invention will now be described with reference to the drawings. In the drawings, the same or corresponding components are denoted by the same reference characters, and the description thereof will not be repeated.

Tenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 23A and 23B illustrate an example of the measuring operation by control circuit 5 of the touch sensor in the tenth embodiment of the present invention.

Referring to FIGS. 23A and 23B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, and the measuring operation in the sixth embodiment in which respective lengths of measurement periods are set equal to each other. This control circuit 5, however, does not perform the measuring operation in the fourth embodiment in which a determination about voltage VO is made at the timing of one of count clocks received from a plurality of delay elements, and the measuring operation in the fifth embodiment in which the majority rule is applied to respective results of level determinations.

Specifically, control circuit 5 makes respective lengths of measurement periods equal to each other by controlling the period from the end of a determination timing selection period, which corresponds to 16 periods of the count clock in a main measuring operation, to the start of the following discharging operation.

The present embodiment having the above-described features can further suppress erroneous determination due to noise with varying potential, and thus can further lessen the influence of noise and appropriately determine whether a touch electrode is touched by a human body, as compared with the touch sensor in the ninth embodiment.

Features and operations except for the above-described ones are similar to those of the touch sensor in the ninth embodiment, and the detailed description thereof will not be repeated.

A further embodiment of the present invention will now be described with reference to the drawings. In the drawings, the same or corresponding components are denoted by the same reference characters, and the description thereof will not be repeated.

Eleventh Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 24A and 24B illustrate an example of the measuring operation by a control circuit of the touch sensor in the eleventh embodiment of the present invention.

Referring to FIGS. 24A and 24B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, and the measuring operation in the sixth embodiment in which respective lengths of measurement periods are set equal to each other. This control circuit 5, however, does not perform the measuring operation in the fifth embodiment in which the majority rule is applied to respective results of level determinations.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the tenth embodiment.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Twelfth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 25A and 25B illustrate an example of the measuring operation by a control circuit of the touch sensor in the twelfth embodiment of the present invention.

Referring to FIGS. 25A and 25B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, and the measuring operation in the fifth embodiment in which the result of majority-based determination as to the level is obtained for use as a result of one main measuring operation. This control circuit 5, however, does not perform the measuring operation in the fourth embodiment in which a determination about voltage VO is made at the timing of one of count clocks received from a plurality of delay elements, and the measuring operation in the sixth embodiment in which respective lengths of measurement periods are set equal to each other.

For example, control circuit 5 in a main measuring operation makes a level determination three times to which the majority rule is to be applied, and the timings at which the three determinations are started are made different from one measurement period to another.

The present embodiment having the above-described features can further lessen the influence of noise and appropriately determine whether a touch electrode is touched by a human body, as compared with the touch sensor in the seventh embodiment.

Features and operations except for the above-described ones are similar to those of the touch sensor in the seventh embodiment, and the detailed description thereof will not be repeated.

A further embodiment of the present invention will now be described with reference to the drawings. In the drawings, the same or corresponding components are denoted by the same reference characters, and the description thereof will not be repeated.

Thirteenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the first embodiment.

FIGS. 26A and 26B illustrate an example of the measuring operation by a control circuit of the touch sensor in the thirteenth embodiment of the present invention.

Referring to FIGS. 26A and 26B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, and the measuring operation in the fifth embodiment in which the result of majority-based determination as to the level is obtained for use as a result of one main measuring operation. This control circuit 5, however, does not perform the measuring operation in the sixth embodiment in which respective lengths of measurement periods are set equal to each other.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the twelfth embodiment.

Features and operations except for the above-described ones are similar to those of the touch sensor in the twelfth embodiment, and the detailed description thereof will not be repeated.

A further embodiment of the present invention will now be described with reference to the drawings. In the drawings, the same or corresponding components are denoted by the same reference characters, and the description thereof will not be repeated.

Fourteenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 27A and 27B illustrate an example of the measuring operation by a control circuit of the touch sensor in the fourteenth embodiment of the present invention.

Referring to FIGS. 27A and 27B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, the measuring operation in the fifth embodiment in which the result of majority-based determination as to the level is obtained for use as a result of one main measuring operation, and the measuring operation in the sixth embodiment in which respective lengths of measurement periods are set equal to each other. This control circuit 5, however, does not perform the measuring operation in the fourth embodiment in which a determination about voltage VO is made at the timing of one of count clocks received from a plurality of delay elements.

For example, control circuit 5 operates so that the length of a combination of a determination timing selection period corresponding to 16 periods of the count clock and three level determination periods to which the majority rule is applied, is equal to ((16+the number of determinations to which the majority rule is applied)−1) cycles (one cycle corresponds to one period of the count clock) in each measurement period.

The present embodiment having the above-described features can further lessen the influence of noise and appropriately determine whether a touch electrode is touched by a human body, as compared with the touch sensor in the tenth embodiment.

Features and operations except for the above-described ones are similar to those of the touch sensor in the tenth embodiment, and the detailed description thereof will not be repeated.

A further embodiment of the present invention will now be described with reference to the drawings. In the drawings, the same or corresponding components are denoted by the same reference characters, and the description thereof will not be repeated.

Fifteenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 28A and 28B illustrate an example of the measuring operation by a control circuit of the touch sensor in the fifteenth embodiment of the present invention.

Referring to FIGS. 28A and 28B, control circuit 5 performs the measuring operation in the second embodiment in which a pre-measuring operation and a main measuring operation are performed in one measurement period, the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, the measuring operation in the fifth embodiment in which the result of majority-based determination as to the level is obtained for use as a result of one main measuring operation, and the measuring operation in the sixth embodiment in which respective lengths of measurement periods are set equal to each other.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the fourteenth embodiment.

Features and operations except for the above-described ones are similar to those of the touch sensor in the fourteenth embodiment, and the detailed description thereof will not be repeated.

A further embodiment of the present invention will now be described with reference to the drawings. In the drawings, the same or corresponding components are denoted by the same reference characters, and the description thereof will not be repeated.

Sixteenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

Figure 29A:
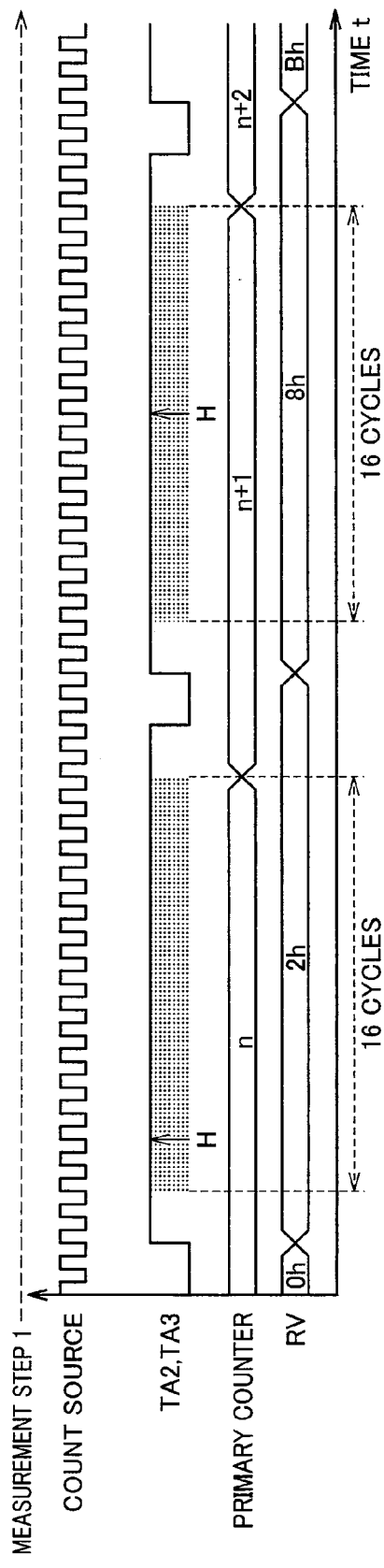
Figure 29B:
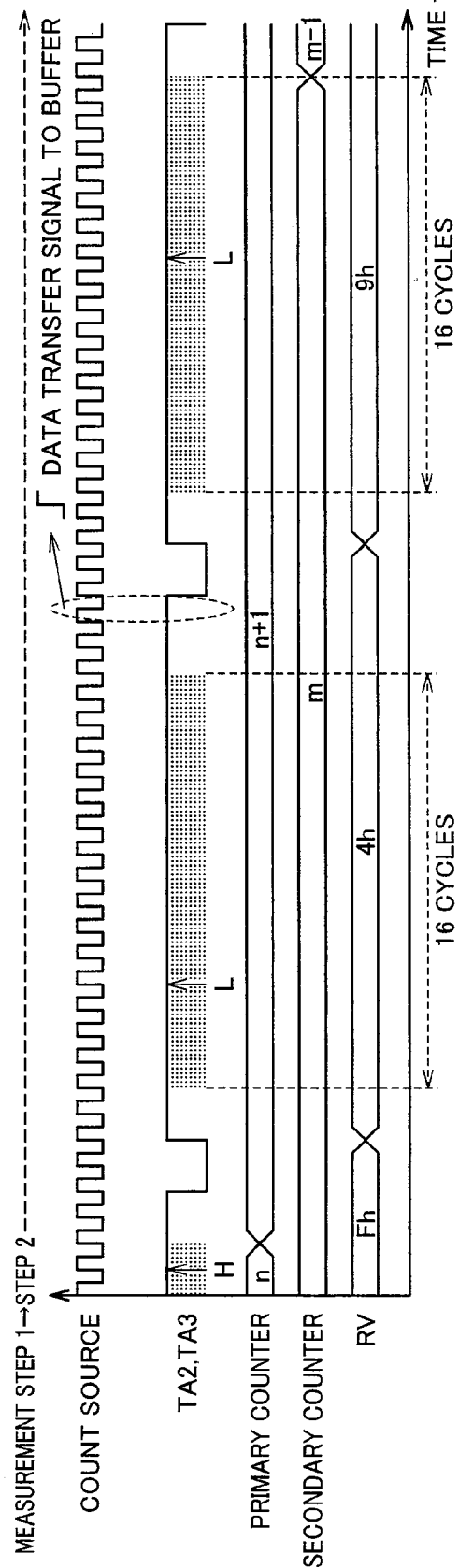

FIGS. 29A and 29B illustrate an example of the measuring operation by a control circuit of the touch sensor in the sixteenth embodiment of the present invention.

Referring to FIGS. 29A and 29B, control circuit 5 performs the measuring operation in the third embodiment in which one of a plurality of edges of a count clock in one measurement period is selected for use as the timing of making a determination about voltage VO, and the measuring operation in the sixth embodiment in which respective lengths of measurement periods are set equal to each other. This control circuit 5, however, does not perform the measuring operation in the second embodiment in which a pre-measuring operation and a main measuring operation are performed in one measurement period, the measuring operation in the fourth embodiment in which a determination about voltage VO is made at the timing of one of count clocks received from a plurality of delay elements, and the measuring operation in the fifth embodiment in which the majority rule is applied to respective results of level determinations.

For example, control circuit 5 operates so that the timing at which a determination about voltage VO is made in a main measuring operation is different from one measurement period to another. Further, control circuit 5 makes respective lengths of measurement periods equal to each other by controlling the period from the end of a determination timing selection period, which corresponds to 16 periods of the count clock in a main measuring operation, to the start of the following discharging operation.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Seventeenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the first embodiment.

FIGS. 30A and 30B illustrate an example of the measuring operation by a control circuit of the touch sensor in the seventeenth embodiment of the present invention.

Referring to FIGS. 30A and 30B, control circuit 5 performs the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, and the measuring operation in the sixth embodiment in which respective lengths of measurement periods are set equal to each other. This control circuit 5, however, does not perform the measuring operation in the second embodiment in which a pre-measuring operation and a main measuring operation are performed in one measurement period, and the measuring operation in the fifth embodiment in which the majority rule is applied to respective results of level determinations.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the sixteenth embodiment.

Features and operations except for the above-described ones are similar to those of the touch sensor in the sixteenth embodiment, and the detailed description thereof will not be repeated.

A further embodiment of the present invention will now be described with reference to the drawings. In the drawings, the same or corresponding components are denoted by the same reference characters, and the description thereof will not be repeated.

Eighteenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

Figure 31A:
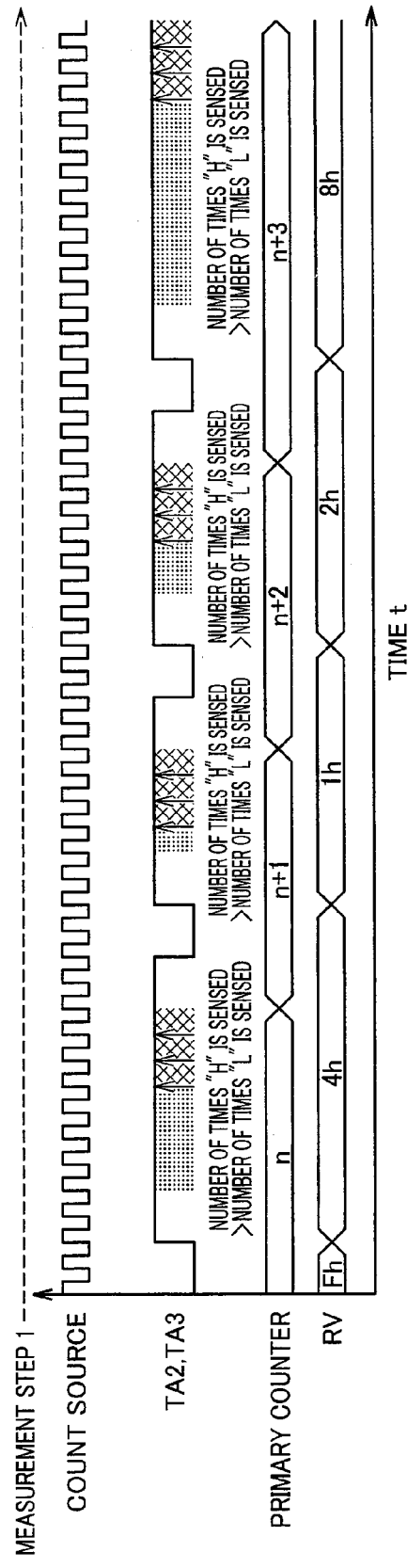
Figure 31B:
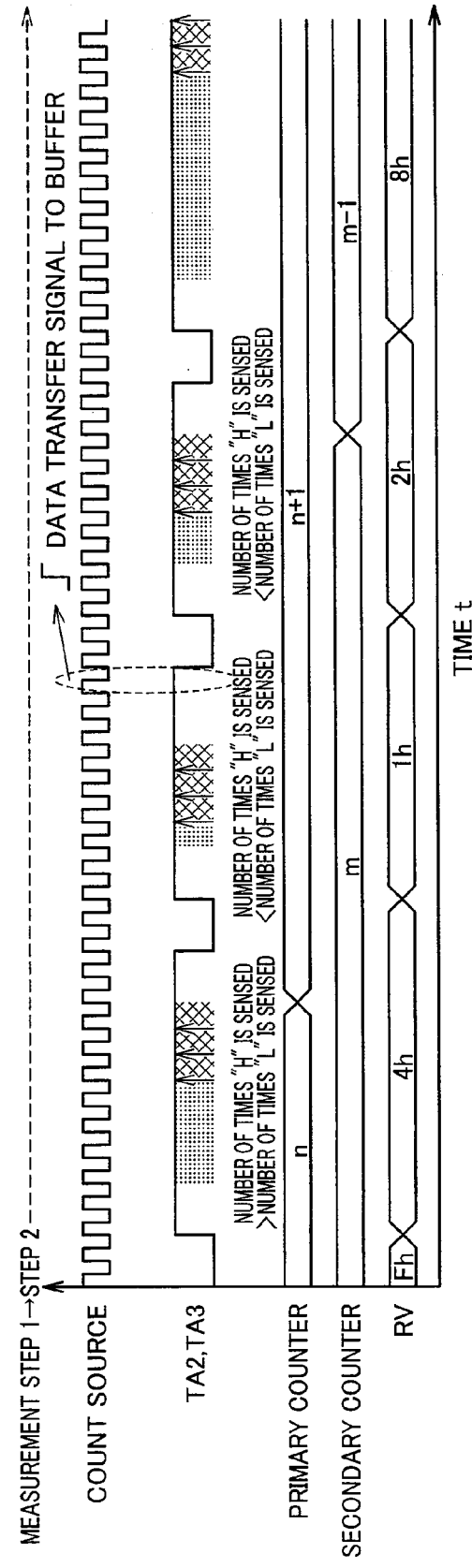

FIGS. 31A and 31B illustrate an example of the measuring operation by a control circuit of the touch sensor in the eighteenth embodiment of the present invention.

Referring to FIGS. 31A and 31B, control circuit 5 performs the measuring operation in the third embodiment in which one of a plurality of edges of a count clock in one measurement period is selected for use as the timing of making a determination about voltage VO, and the measuring operation in the fifth embodiment in which the result of majority-based determination as to the level is obtained for use as a result of one main measuring operation. This control circuit 5, however, does not perform the measuring operation in the second embodiment in which a pre-measuring operation and a main measuring operation are performed in one measurement period, the measuring operation in the fourth embodiment in which a determination about voltage VO is made at the timing of one of count clocks received from a plurality of delay elements, and the measuring operation in the sixth embodiment in which respective lengths of measurement periods are set equal to each other.

Features and operations except for the above-described ones are similar to those of the touch sensor in the second embodiment, and the detailed description thereof will not be repeated.

A further embodiment of the present invention will now be described with reference to the drawings. In the drawings, the same or corresponding components are denoted by the same reference characters, and the description thereof will not be repeated.

Nineteenth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

Figure 32A:
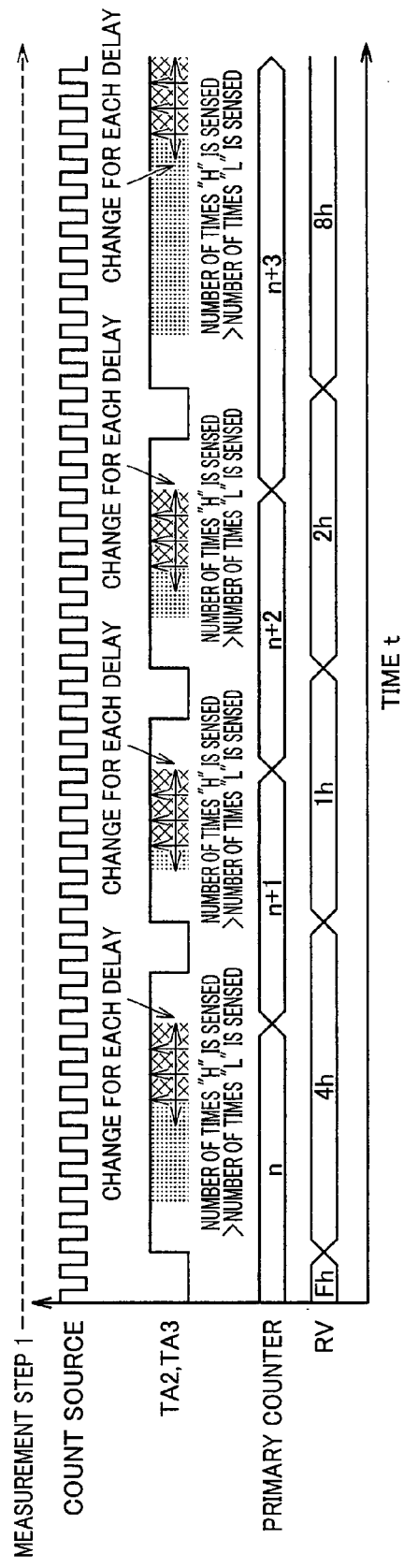
Figure 32B:
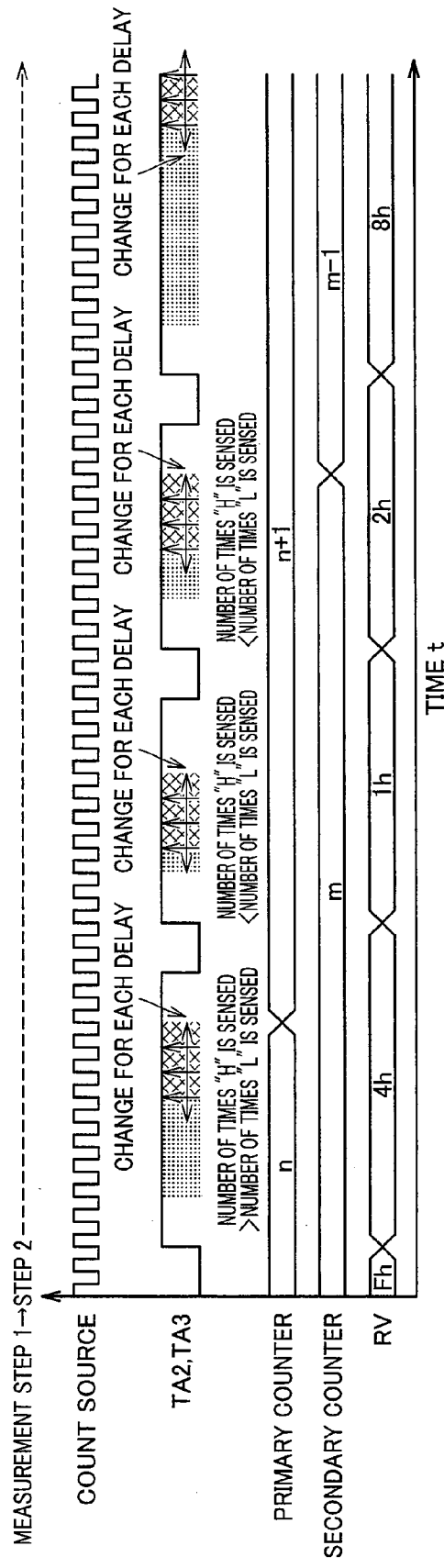

FIGS. 32A and 32B illustrate an example of the measuring operation by a control circuit of the touch sensor in the nineteenth embodiment of the present invention.

Referring to FIGS. 32A and 32B, control circuit 5 performs the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, and the measuring operation in the fifth embodiment in which the result of majority-based determination as to the level is obtained for use as a result of one main measuring operation. This control circuit 5, however, does not perform the measuring operation in the second embodiment in which a pre-measuring operation and a main measuring operation are performed in one measurement period, and the measuring operation in the sixth embodiment in which respective lengths of measurement periods are set equal to each other.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the eighteenth embodiment.

Features and operations except for the above-described ones are similar to those of the touch sensor in the eighteenth embodiment, and the detailed description thereof will not be repeated.

A further embodiment of the present invention will now be described with reference to the drawings. In the drawings, the same or corresponding components are denoted by the same reference characters, and the description thereof will not be repeated.

Twentieth Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 33A and 33B illustrate an example of the measuring operation by a control circuit of the touch sensor in the twentieth embodiment of the present invention.

Referring to FIGS. 33A and 33B, control circuit 5 performs the measuring operation in the third embodiment in which one of a plurality of edges of a count clock in one measurement period is selected for use as the timing of making a determination about voltage VO, the measuring operation in the fifth embodiment in which the result of majority-based determination as to the level is obtained for use as a result of one main measuring operation, and the measuring operation in the sixth embodiment in which respective lengths of measurement periods are set equal to each other. This control circuit 5, however, does not perform the measuring operation in the second embodiment in which a pre-measuring operation and a main measuring operation are performed in one measurement period, and the measuring operation in the fourth embodiment in which a determination about voltage VO is made at the timing of one of count clocks received from a plurality of delay elements.

For example, control circuit 5 operates so that the length of a combination of a determination timing selection period corresponding to 16 periods of the count clock and three level determination periods to which the majority rule is applied, is equal to ((16+the number of determinations to which the majority rule is applied)−1) cycles (one cycle corresponds to one period of the count clock) in each measurement period.

The present embodiment having the above-described features can further lessen the influence of noise and appropriately determine whether a touch electrode is touched by a human body, as compared with the touch sensor in the eighteenth embodiment.

Features and operations except for the above-described ones are similar to those of the touch sensor in the eighteenth embodiment, and the detailed description thereof will not be repeated.

A further embodiment of the present invention will now be described with reference to the drawings. In the drawings, the same or corresponding components are denoted by the same reference characters, and the description thereof will not be repeated.

Twenty-First Embodiment

The present embodiment relates to a touch sensor using a combination of at least two of different touch sensing methods used by the touch sensors in the second to sixth embodiments. Except for the details described below, the touch sensor in the present embodiment is similar to the touch sensor in the second embodiment.

FIGS. 34A and 34B illustrate an example of the measuring operation by a control circuit of the touch sensor in the twenty-first embodiment of the present invention.

Referring to FIGS. 34A and 34B, control circuit 5 performs the measuring operation in the third embodiment in which one of a plurality of edges of a count clock in one measurement period is selected for use as the timing of making a determination about voltage VO, the measuring operation in the fourth embodiment in which a determination about voltage VO is made at the timing of one of count clocks received from a plurality of delay elements, the measuring operation in the fifth embodiment in which the result of majority-based determination as to the level is obtained for use as a result of one main measuring operation, and the measuring operation in the sixth embodiment in which respective lengths of measurement periods are set equal to each other. This control circuit 5, however, does not perform the measuring operation in the second embodiment in which a pre-measuring operation and a main measuring operation are performed in one measurement period.

For example, the sum of respective delay times of delay elements in clock delay selection circuit DLY is set shorter than one period of a count clock.

Control circuit 5 can select, for each measurement period, one of respective delay clocks that are output from a plurality of delay elements in clock delay selection circuit DLY, and can select, for each measurement period, one of a plurality of edges of the delay clock in the measurement period. Following the timing of the selected edge of the selected delay clock, control circuit 5 makes a comparison between the voltage level of external terminal TA3 and threshold voltage VTH.

The present embodiment having the above-described features can more precisely control the timing at which a determination about voltage VO is made, further lessen the influence of noise, and appropriately determine whether a touch electrode is touched by a human body, as compared with the touch sensor in the twentieth embodiment.

Features and operations except for the above-described ones are similar to those of the touch sensor in the twentieth embodiment, and the detailed description thereof will not be repeated.

A further embodiment of the present invention will now be described with reference to the drawings. In the drawings, the same or corresponding components are denoted by the same reference characters, and the description thereof will not be repeated.

Twenty-Second Embodiment

The present embodiment relates to a touch sensor having peripherals for touch electrodes different from those of the touch sensor in the first embodiment. Except for details described below, the touch sensor in the present embodiment is similar to the touch sensor in the first embodiment.

Figure 35:
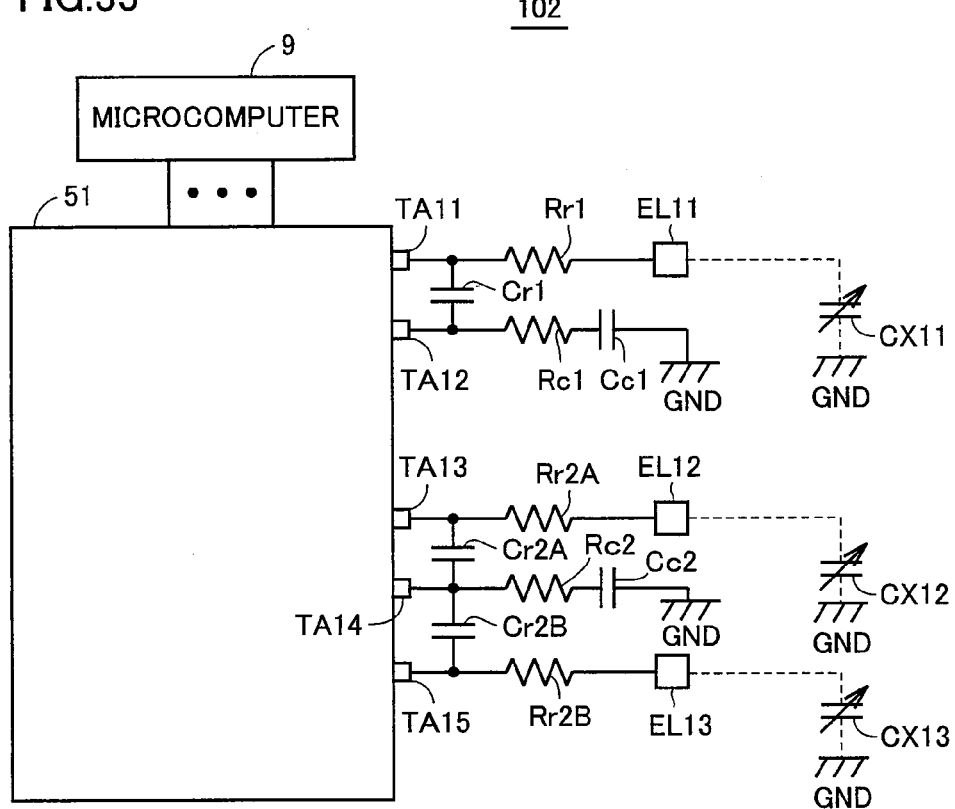
FIG. 35 illustrates a configuration of a touch sensor according to a twenty-second embodiment of the present invention.

FIG. 35 illustrates a configuration of the touch sensor in the twenty-second embodiment of the present invention. Referring to FIG. 35, touch sensor 102 includes a touch sensor IC (semiconductor device) 51, touch electrodes EL11 to EL13, capacitors Cr1, Cr2A, Cr2B, Cc1, Cc2, resistor elements Rr1, Rr2A, Rr2B, Rc1, Rc2, and a microcomputer 9. Touch sensor IC 51 includes a plurality of external terminals TA11 to TA15.

Capacitor Cc1 has one electrode connected to one electrode of resistor element Rc1, and the other electrode receiving ground voltage GND. The other electrode of resistor element Rc1 is connected to external terminal TA12. Touch electrode EL11 is connected to one electrode of resistor element Rr1. The other electrode of resistor element Rr1 is connected to external terminal TA11. Capacitor Cr1 is connected between resistor elements Rr1 and Rc1.

Capacitor Cc2 has one electrode connected to one electrode of resistor element Rc2, and the other electrode receiving ground voltage GND. The other electrode of resistor element Rc2 is connected to external terminal TA14. Touch electrode EL12 is connected to one electrode of resistor element Rr2A. The other electrode of resistor element Rr2A is connected to external terminal TA13. Capacitor Cr2A is connected between resistor elements Rr2A and Rc2. Touch electrode EL13 is connected to one electrode of resistor element Rr2B. The other electrode of resistor element Rr2B is connected to external terminal TA15. Capacitor Cr2B is connected between resistor elements Rr2B and Rc2.

Respective capacitances provided by touch electrodes EL11 to EL13 are represented by variable-capacitance capacitors CX11 to CX13.

Touch sensor IC 51 sets external terminal TA11 to the HiZ state and sets external terminal TA12 to "H" level. Accordingly, capacitors Cc1, Cr1, CX11 are charged.

Next, touch sensor IC 51 sets external terminal TA12 to the HiZ state. Accordingly, charging of capacitors Cc1, Cr1, CX11 is stopped.

Next, touch sensor IC 51 keeps external terminal TA12 in the HiZ state and sets external terminal TA11 to "L" level. Accordingly, a part of the charge stored in capacitor Cc1 flows to external terminal TA11, the voltage of external terminal TA12 decreases, all charges stored in capacitors Cr1, CX11 are released, and the voltage across terminals of capacitors Cr1, CX11 each is reset to 0 V.

Next, touch sensor IC 51 keeps external terminal TA12 in the HiZ state and sets external terminal TA11 to the HiZ state. Accordingly, a part of the charge stored in capacitor Cc1 is distributed via resistor elements Rc1, Rr1 to capacitors Cr1, CX11, and voltage VO of external terminal TA11 increases.

Next, when a predetermined time has elapsed from the time when external terminals TA11 and TA12 are set to the HiZ state, touch sensor IC 51 makes a comparison between respective levels of voltage VO of external terminal TA11 and threshold voltage VTH. When the relation VO>VTH holds, it is determined that voltage VO is "H" level. When the relation VO<VTH holds, it is determined that voltage VO is "L" level.

Touch sensor IC 51 alternately performs the discharging operation of releasing the charges stored in capacitors Cr1, CX11, and the distributing operation of distributing a part of the charge stored in capacitor Cc1 to capacitors Cr1, CX11. Following a method similar to the one for touch sensor IC 51, a determination is made as to whether touch electrode EL11 is touched by a human body, or data for making the determination is generated and, a signal representing the result of the determination or a signal representing the fact that the data for making the determination has been generated, is output to microcomputer 9.

Control circuit 5 selects remaining touch electrodes EL12 and EL13 one by one successively and, similarly to touch electrode EL11, determines whether each touch electrode EL is touched by a human body. Control circuit 5 outputs, to microcomputer 9, a signal representing whether touch electrode EL is touched by a human body. Here, peripherals corresponding to those including a capacitor and resistor elements provided for touch electrode EL, are commonly provided for touch electrodes EL12 and EL13. The way to make a determination as to the level for external terminals TA12 and TA13 is similar to the one for external terminal TA11 as described above, and the detailed description thereof will not be repeated.

Microcomputer 9 controls touch sensor IC 51, receives from touch sensor IC 51 a signal representing whether touch electrodes EL11 to EL13 are each touched by a human body, and controls an electrical device to be controlled in response to the signal.

Features and operations except for the above-described ones are similar to those of the touch sensor in the first embodiment, and the detailed description thereof will not be repeated.

As seen from above, the touch sensor of the present invention is not limited to the configuration as shown in FIG. 1, and touch sensor IC 51 configured as shown in FIG. 35 may be used for the touch sensor of the present invention.

The touch sensor of the present invention is applicable to an operating unit of a peripheral (display, printer or the like) of a microcomputer. The touch sensor of the present invention is also applicable to a touch panel of a mobile phone, personal digital assistant or liquid crystal panel. The touch sensor of the present invention is further applicable to touch keys of an electrical home appliance such as IH cooking heater, washing machine, microwave oven, range hood (ventilating fan) or the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a plurality of first terminals connected to a plurality of touch electrodes, respectively;
a second terminal connected via a capacitor to a line of a reference voltage;
a switch circuit for connecting, to a predetermined node, one of said plurality of first terminals that is associated with a touch electrode selected from said plurality of touch electrodes; and
a charging and discharging circuit for performing a charging operation of charging said capacitor, a discharging operation of releasing a charge of said selected touch electrode, and a distributing operation of distributing a charge of said capacitor via said predetermined node to said selected touch electrode,
whether said selected touch electrode is touched by a human body being determined based on a voltage of said predetermined node;
the semiconductor device further comprising:
a third terminal connected via a resistor element to said second terminal; and
a fourth terminal connected via a sub capacitor to said third terminal and connected to said predetermined node, wherein
said charging and discharging circuit in said charging operation charges said capacitor by applying a first voltage to said second terminal and said predetermined node, said charging and discharging circuit in said discharging operation releases a charge of said sub capacitor and a charge of said selected touch electrode by applying a second voltage lower than said first voltage to said third terminal and said fourth terminal, and said charging and discharging circuit in said distributing operation distributes a charge of said capacitor to said selected touch electrode via said resistor element, said sub capacitor and said predetermined node by setting said first to third terminals in a high-impedance state.

2. The semiconductor device according to claim 1, further comprising a sensing circuit for sensing the voltage of said predetermined node and generating, based on a result of the sensing, a signal representing whether said selected touch electrode is touched by a human body.

3. The semiconductor device according to claim 1, wherein said charging and discharging circuit alternately performs said discharging operation and said distributing operation after performing said charging operation, and
said semiconductor device further comprises a sensing circuit for making a comparison between the voltage of said predetermined node and a predetermined threshold voltage in a measurement period from a start of said distributing operation to a start of subsequent said discharging operation and generating, based on a result of the comparison, a signal representing whether said selected touch electrode is touched by a human body.

4. The semiconductor device according to claim 3, wherein said sensing circuit makes a comparison N times (N is an integer of not less than 2) at respective timings different from each other in said measurement period, between the voltage of said predetermined node and said predetermined threshold voltage and, based on a result of the comparison made N times, generates a signal representing whether said selected touch electrode is touched by a human body.

5. The semiconductor device according to claim 4, wherein the timings at which the comparison between the voltage of said predetermined node and said predetermined threshold voltage is made N times respectively are made different from one measurement period to another measurement period.

6. The semiconductor device according to claim 5, further comprising:
a clock generation circuit for generating a clock signal of a predetermined frequency; and
a selection circuit for selecting, for each measurement period, N edges from a plurality of edges of said clock signal, wherein
said sensing circuit makes said comparison N times respectively in response to the N edges selected by said selection circuit.

7. The semiconductor device according to claim 5, further comprising:
a clock generation circuit for generating a clock signal of a predetermined frequency;
a plurality of delay elements connected in series including a delay element in an initial stage receiving said clock signal, said delay elements each delaying the clock signal output from a preceding stage by a predetermined time and providing the delayed clock signal to a subsequent stage;
a first selection circuit for selecting one of respective clock signals that are output from said plurality of delay elements; and
a second selection circuit for selecting, for each measurement period, N edges from a plurality of edges of the clock signal selected by said first selection circuit, wherein
said sensing circuit makes said comparison N times respectively in response to the N edges selected by said second selection circuit.

8. The semiconductor device according to claim 4, wherein said sensing circuit makes a comparison between the number of times a first comparison result is obtained and the number of times a second comparison result is obtained, generates, based on one of said first comparison result and said second comparison result that is obtained a larger number of times, a signal representing whether said selected touch electrode is touched by a human body, said first comparison result is that the voltage of said predetermined node is higher than said predetermined threshold voltage, and said second comparison result is that the voltage of said predetermined node is lower than said predetermined threshold voltage.

9. The semiconductor device according to claim 4, wherein said charging and discharging circuit performs said discharging operation in response to completion of an Nth comparison between the voltage of said predetermined node and said predetermined threshold voltage by said sensing circuit in each measurement period.

10. The semiconductor device according to claim 4, wherein
said charging and discharging circuit alternately performs said discharging operation and said distributing operation at certain intervals.

11. The semiconductor device according to claim 1, wherein
said semiconductor device is formed at a surface of a semiconductor substrate,
the surface of said semiconductor substrate is divided into an analog region and a digital region,
analog circuitry of said semiconductor device is placed in said analog region, and
digital circuitry of said semiconductor device is placed in said digital region.

12. A touch sensor comprising a plurality of touch electrodes, a capacitor and a semiconductor device,
said semiconductor device including:
a plurality of first terminals connected to said plurality of touch electrodes, respectively;
a second terminal connected via said capacitor to a line of a reference voltage;
a switch circuit for connecting, to a predetermined node, one of said plurality of first terminals that is associated with a touch electrode selected from said plurality of touch electrodes; and
a charging and discharging circuit for performing a charging operation of charging said capacitor, a discharging operation of releasing a charge of said selected touch electrode, and a distributing operation of distributing a charge of said capacitor via said predetermined node to said selected touch electrode,
whether said selected touch electrode is touched by a human body being determined based on a voltage of said predetermined node;
the touch sensor further comprising a resistor element and a sub capacitor, wherein
said semiconductor device further includes:
a third terminal connected via said resistor element to said second terminal; and a fourth terminal connected via said sub capacitor to said third terminal and connected to said predetermined node, and
said charging and discharging circuit in said charging operation charges said capacitor by applying a first voltage to said second terminal and said predetermined node, said charging and discharging circuit in said discharging operation releases a charge of said sub capacitor and a charge of said selected touch electrode by applying a second voltage lower than said first voltage to said third terminal and said fourth terminal, and said charging and discharging circuit in said distributing operation distributes a charge of said capacitor to said selected touch electrode via said resistor element, said sub capacitor and said predetermined node by setting said first to third terminals in a high-impedance state.

13. The touch sensor according to claim 12, wherein
said charging and discharging circuit alternately performs said discharging operation and said distributing operation after performing said charging operation, and
said semiconductor device further includes a sensing circuit, said sensing circuit makes a comparison N times (N is an integer of not less than 2) at respective timings different from each other in a measurement period from a start of said distributing operation to a start of subsequent said discharging operation, the comparison is made between the voltage of said predetermined node and a predetermined threshold voltage and, based on a result of the comparison made N times, said sensing circuit generates a signal representing whether said selected touch electrode is touched by a human body.

* * * * *